United States Patent
Petunin et al.

(10) Patent No.: US 7,587,695 B2
(45) Date of Patent: Sep. 8, 2009

(54) PROTECTION BOUNDARIES IN A PARALLEL PRINTED CIRCUIT BOARD DESIGN ENVIRONMENT

(75) Inventors: Vladimir V. Petunin, Longmont, CO (US); Charles L. Pfeil, Louisville, CO (US)

(73) Assignee: Mentor Graphics Corporation, Wilsonville, OR (US)

( * ) Notice: Subject to any disclaimer, the term of this patent is extended or adjusted under 35 U.S.C. 154(b) by 113 days.

(21) Appl. No.: 10/869,923

(22) Filed: Jun. 18, 2004

(65) Prior Publication Data

US 2004/0225988 A1    Nov. 11, 2004

Related U.S. Application Data

(63) Continuation-in-part of application No. 10/780,902, filed on Feb. 19, 2004, which is a continuation of application No. 10/269,614, filed on Oct. 10, 2002, now Pat. No. 6,708,313.

(60) Provisional application No. 60/523,697, filed on Nov. 21, 2003, provisional application No. 60/341,037, filed on Dec. 10, 2001.

(51) Int. Cl.
*G06F 17/50* (2006.01)
(52) U.S. Cl. ............. 716/11; 716/8; 716/9; 716/10; 707/8; 707/10; 707/200; 707/201; 703/20; 715/754
(58) Field of Classification Search .......... 716/8–11; 707/8, 201, 10, 200; 703/20; 715/754
See application file for complete search history.

(56) References Cited

U.S. PATENT DOCUMENTS

| | | | |
|---|---|---|---|
| 5,107,443 A | 4/1992 | Smith et al. |
| 5,258,920 A | 11/1993 | Haller et al. |
| 5,295,081 A | 3/1994 | Habra |
| 5,333,312 A | 7/1994 | Wang |
| 5,333,315 A | 7/1994 | Saether et al. |
| 5,333,316 A | 7/1994 | Champagne et al. |

(Continued)

FOREIGN PATENT DOCUMENTS

EP    0550370    7/1993

(Continued)

OTHER PUBLICATIONS

Michael K.W. Wu et al., "Development of an Integrated CAD Tool for Switching Power Supply Design with EMC Performance Evaluation," *IEEE Transactions on Industry Applications*, vol. 34, No. 2 pp. 364-373, Mar.-Apr. 1998).

(Continued)

*Primary Examiner*—Naum B Levin
(74) *Attorney, Agent, or Firm*—Banner & Witcoff, Ltd.

(57) ABSTRACT

Multiple users may simultaneously edit a shared area of a printed circuit board design. In order to prevent conflicts between multiple users, a user draws a protection border around a portion of his or her workspace so as to temporarily reserve the protected portion and prevent editing by other users. The protection border may be broadcast to other users. The protection border may also define a protected region in which a user may evaluate alternative design changes without requesting corresponding changes to a master PCB design.

44 Claims, 25 Drawing Sheets

U.S. PATENT DOCUMENTS

| | | | |
|---|---|---|---|
| 5,339,388 | A | 8/1994 | Bates et al. |
| 5,392,400 | A | 2/1995 | Berkowitz |
| 5,452,218 | A | 9/1995 | Tucker et al. |
| 5,515,491 | A * | 5/1996 | Bates et al. ............... 715/754 |
| 5,544,067 | A | 8/1996 | Rostoker et al. |
| 5,555,388 | A * | 9/1996 | Shaughnessy ............... 711/100 |
| 5,583,993 | A * | 12/1996 | Foster et al. ............... 709/205 |
| 5,604,680 | A | 2/1997 | Bamji et al. |
| 5,745,747 | A * | 4/1998 | Chang et al. ............... 707/8 |
| 5,751,597 | A * | 5/1998 | Okano et al. ............... 716/5 |
| 5,806,058 | A | 9/1998 | Mori et al. |
| 5,809,240 | A | 9/1998 | Kumagai |
| 5,826,265 | A | 10/1998 | Van Huben et al. |
| 5,892,900 | A * | 4/1999 | Ginter et al. ............... 726/26 |
| 5,950,201 | A | 9/1999 | Van Huben et al. |
| 5,966,707 | A * | 10/1999 | Van Huben et al. ........... 707/10 |
| 5,983,277 | A | 11/1999 | Heile et al. |
| 6,023,565 | A | 2/2000 | Lawman et al. |
| 6,026,230 | A | 2/2000 | Lin et al. |
| 6,094,654 | A | 7/2000 | Van Huben et al. |
| 6,110,213 | A | 8/2000 | Vinciarelli et al. |
| 6,110,223 | A | 8/2000 | Southgate et al. |
| 6,134,549 | A | 10/2000 | Regnier et al. |
| 6,134,705 | A | 10/2000 | Pedersen et al. |
| 6,182,115 | B1 * | 1/2001 | Cuomo et al. ............... 709/204 |
| 6,240,414 | B1 | 5/2001 | Beizer et al. |
| 6,289,254 | B1 | 9/2001 | Shimizu et al. |
| 6,327,594 | B1 * | 12/2001 | Van Huben et al. ......... 707/200 |
| 6,484,177 | B1 * | 12/2001 | Van Huben et al. ........... 707/10 |
| 6,356,796 | B1 | 3/2002 | Spruiell et al. |
| 6,424,959 | B1 | 7/2002 | Bennett et al. |
| 6,442,570 | B1 | 8/2002 | Wu |
| 6,530,065 | B1 | 3/2003 | McDonald et al. |
| 6,578,174 | B2 | 6/2003 | Zizzo |
| 6,594,799 | B1 | 7/2003 | Robertson et al. |
| 6,654,747 | B1 * | 11/2003 | Van Huben et al. ........... 707/10 |
| 6,671,699 | B1 * | 12/2003 | Black et al. ............... 707/201 |
| 6,678,871 | B2 | 1/2004 | Takeyama et al. |
| 6,678,876 | B2 | 1/2004 | Stevens et al. |
| 6,678,877 | B1 | 1/2004 | Perry et al. |
| 6,684,379 | B2 | 1/2004 | Skoll et al. |
| 6,687,710 | B1 | 2/2004 | Dey |
| 6,708,313 | B2 | 3/2004 | Pfeil et al. |
| 6,711,718 | B2 * | 3/2004 | Pfeil et al. ............... 716/1 |
| 6,721,922 | B1 | 4/2004 | Walters et al. |
| 6,751,781 | B2 | 6/2004 | Lin et al. |
| 6,782,511 | B1 | 8/2004 | Frank et al. |
| 6,851,094 | B1 | 2/2005 | Robertson et al. |
| 6,851,100 | B1 | 2/2005 | You et al. |
| 6,931,369 | B1 | 8/2005 | Perry et al. |
| 6,983,232 | B2 | 1/2006 | Nguyen et al. |
| 6,983,434 | B1 | 1/2006 | Frank et al. |
| 7,024,433 | B2 | 4/2006 | Arai et al. |
| 7,036,101 | B2 * | 4/2006 | He et al. ............... 716/7 |
| 7,039,892 | B2 | 5/2006 | Mantey et al. |
| 7,076,491 | B2 | 7/2006 | Tsao |
| 7,103,434 | B2 | 9/2006 | Chernyak et al. |
| 7,134,096 | B2 | 11/2006 | Brathwaite et al. |
| 7,143,134 | B2 | 11/2006 | Petri et al. |
| 7,143,341 | B1 | 11/2006 | Kohli |
| 7,219,311 | B2 | 5/2007 | Koga et al. |
| 7,240,309 | B2 | 7/2007 | Saito et al. |
| 7,246,055 | B1 | 7/2007 | Singh |
| 7,337,093 | B2 | 2/2008 | Ramani et al. |
| 2002/0059054 | A1 * | 5/2002 | Bade et al. ............... 703/20 |
| 2002/0069220 | A1 | 6/2002 | Tran |
| 2002/0120858 | A1 | 8/2002 | Porter et al. |
| 2002/0144212 | A1 | 10/2002 | Lev et al. |
| 2002/0188910 | A1 | 12/2002 | Zizzo |
| 2003/0009727 | A1 | 1/2003 | Takeyama et al. |
| 2003/0018655 | A1 | 1/2003 | Arroyo et al. |
| 2003/0101425 | A1 | 5/2003 | Makinen |
| 2003/0131332 | A1 | 7/2003 | Pfeil et al. |
| 2004/0093397 | A1 | 5/2004 | Chiroglazov et al. |
| 2004/0199891 | A1 | 10/2004 | Bentley et al. |
| 2004/0268283 | A1 | 12/2004 | Perry et al. |
| 2005/0044518 | A1 | 2/2005 | Petunin et al. |
| 2005/0080502 | A1 | 4/2005 | Chernyak |
| 2005/0108663 | A1 | 5/2005 | Bentley et al. |
| 2005/0114821 | A1 | 5/2005 | Petunin et al. |
| 2005/0125763 | A1 | 6/2005 | Lin et al. |
| 2005/0131783 | A1 | 6/2005 | Jin |
| 2005/0160396 | A1 | 7/2005 | Chadzynski |
| 2005/0237776 | A1 | 10/2005 | Gropper et al. |
| 2005/0246672 | A1 | 11/2005 | Bois et al. |
| 2008/0034342 | A1 | 2/2008 | Petunin et al. |
| 2008/0059932 | A1 | 3/2008 | Pfeil et al. |

FOREIGN PATENT DOCUMENTS

| | | |
|---|---|---|
| EP | 0558006 | 9/1993 |
| EP | 07050267 | 6/1995 |
| JP | 02-048774 | 2/1990 |
| JP | 02-056070 | 2/1990 |
| JP | 02-245865 | 10/1990 |
| JP | 04-068470 | 3/1992 |
| JP | 04-362783 | 12/1992 |
| JP | 05-073630 | 3/1993 |
| JP | 0574942 | 3/1993 |
| JP | 05-324360 | 7/1993 |
| JP | 05-242174 | 9/1993 |
| JP | 06203108 | 7/1994 |
| JP | 07175842 | 7/1995 |
| JP | 08-235233 | 9/1996 |
| JP | 0962726 | 3/1997 |
| JP | 09-212530 | 5/1997 |
| JP | 09-288690 | 11/1997 |
| JP | 10-105586 | 4/1998 |
| JP | 10307855 | 11/1998 |
| JP | 11-288428 | 10/1999 |
| JP | 2003-186914 | 7/2003 |
| WO | 03050751 | 5/2003 |
| WO | 03050726 | 6/2003 |
| WO | WO 03/050726 | 6/2003 |
| WO | WO 03088095 | 10/2003 |

OTHER PUBLICATIONS

U.S. Appl. No. 60/341,037, filed Jun. 19, 2003, Pfeil et al.

Geppert, L., "IC Design on the World Wide Web," IEEE Spectrum, Oct. 2001, pp. 31-36.

CAD Framework Initiative, Inc., Printed from <http://www.si2.org> on Jun. 23, 2004 (date of first publication unkown).

English Abstract of JP2003-186914, Jul. 4, 2003.

Machine-Generated English Translation of Portions of JP2003-186914, Jul. 4, 2003.

English Translation of Abstract and Claims of JP2003-186914, Jul. 4, 2003.

Printout of web page at <http://www.stella.co.jp/system/data.htm> and English language translation thereof; date of first publication unknown, but prior to Sep. 9, 2003; (2 pages).

Printout of web page at <http://www.stella.co.jp/system/faq.htm> and English language translation thereof; date of first publication unknown, but prior to Nov. 18, 2003; (5 pages).

Printout of web page at <http://www.stella.co.jp/system/multi.htm> and English language translation thereof; date of first publication unknown, but prior to Sep. 9, 2003; (2 pages).

Printout of web page at <http://www.stella.co.jp/system/option.htm> and English language translation thereof; date of first publication unknown, but prior to Sep. 9, 2003; (2 pages).

Printout of web page at <http://www.stella.co.jp/system/pcb_cad.htm> and English language translation thereof; date of first publication unknown, but prior to Sep. 9, 2003; (2 pages).

Printout of web page at <http://www.stella.co.jp/system/print.htm> and English language translation thereof; date of first publication unknown, but prior to Sep. 9, 2003; (3 pages).
Printout of web page at <http:///www.stella.co.jp/system/stella_station.htm> and English language translation thereof; date of first publication unknown, but prior to Nov. 18, 2003; (3 pages).
Printout of web page at <http://www.stella.co.jp/system/system.htm> and English language translation thereof; date of first publication unknown, but prior to Sep. 9, 2003; (2 pages).
English language translation of web page formerly available at <http://www.ydc.co.jp/cad/epsilon/productC3Design/>;date of first publication unknown, but prior to Feb. 17, 2004; (6 pages).
Mar. 14, 2008 Official Communication in European Patent Application 02 797 245 (6 pages).
Mar. 25, 2008 Third Party Submission in European Patent Application 02 797 245, with attachments (44 pages).
Translation of Jan. 8, 2008 Decision of Refusal in Japanese Patent Application 2003-551734 (3 pages).
May 30, 2007 Office Action in European Patent Application 02 797 245 (6 pages).
Translation of May 29, 2007 Office Action in Japanese Patent Application 2003-551734 (3 pages).
International Preliminary Report on patentability for PCT/US2006/035374 dated Mar. 18, 2008.
Supplementary European Search Report for EP 02 795 797 dated Jul. 3, 2007.
May 14, 2007 Letter supplementing the Search Report and the Supplementary Partial European Search Report dated Oct. 20, 2006.
Feb. 6, 2008 Office Action in EP 02 795 797.6 (3 pages).
English translation of Mar. 8, 2006, submission by undisclosed third party in Japanese Patent Application 2003-551734 (2 pages).
English translation of Mar. 8, 2006, submission by undisclosed third party in Japanese Patent Application 2003-551712 (2 pages).
English translation of Mar. 29, 2007, submission by undisclosed third party in Japanese Patent Application 2003-551734 (7 pages).
English translation of Oct. 25, 2007, submission by undisclosed third party in Japanese Patent Application 2003-551734 (4 pages).
English translation of Sep. 29, 2006, submission by undisclosed third party in Japanese Patent Application 2003-551712 (15 pages).
English translation of Apr. 4, 2007, submission by undisclosed third party in Japanese Patent Application 2003-551734 (9 pages).
English translation of Oct. 25, 2007, submission by undisclosed third party in Japanese Patent Application 2003-551712 (4 pages).
Konduri, et al., "A Framework for Collaborative Design and Distributed Web-Based Design", 1999, pp. 898-903.
Konduri, et al., "Vela Project on Collaborative Distributed Design: New Client/Server Implementations", May 6, 1999, pp. 1-8.
Datasheet for "Allegro PCB Design 220", by Cadence; Mar. 9, 2004, 8 pages.
Saha, et al., "Web-Based Distributed VLSI Design", MIT, published Jan. 4-7, 1998, pp. 449-454.
"Vela Project - Globally Distributed Microsystem Design" by CBL, Jun. 1998, 23 pages.
Google™ Search bearing date of Apr. 28, 2008; provided by examiner of U.S. Appl. No. 10/960,793.
English translation of Jul. 18, 2008, submission by undisclosed third party in European Patent Application 02 795 797.6 (4 pages).
English Translation of Jul. 29, 2008 Office Action in Japanese Patent Application 2008-121618 (10 pages).
International Search Report of PCT/US02/39394 dated Jun. 19, 2003.
Horn, I., et al., "Estimation of the number of routing layers and total wirelength in a PCT through wiring distribution analysis", Design Automation Conference, 1996, Proceedings EURO-DAC'06, Sep. 16-20, 1996, pp. 310-315.
Translation of an Office Action for JP2003551712 dated Aug. 21, 2006.
Translation of an Office Action for JP2003551734 dated Aug. 21, 2006.
Hardwick, M., et al., "Using a Relational Database as an Index to a Distributed Object Database in Engineering Design Systems", IEEE, Oct. 16, 1989, pp. 4-11.

Anupam, V., et al., "Collaborative Multimedia Scientific Design in SHASTRA", 1993, pp. 1-12.
Anupam, V., et al., "SHASTRA: Multimedia Collaborative Design Environment", IEEE Multimedia, vol. 1, No. 2, Jun. 21, 1994, pp. 39-49.
Anupam, V., et al., "SHASTRA-an Architecture for Development of Collaborative Applications", Enabling Technologies: Infrastructure for Collaborative Enterprises, Apr. 20-22, 1993, pp. 155-156.
Honghai, Shen, et al., "Access Control for Collaborative Environments", Oct. 31, 1992, pp. 51-58.
N. Shyamsundar, et al., "Internet-based Collaborative Product Design with Assembly Features and Virtual Design Spaces", Jun. 5, 2001, pp. 637-651.
EP Search Report for EP02795797 dated Oct. 20, 2006.
"Version Management with CVS for CVS 1.12.9", Chapter 10: Multiple Developers, retrieved from the Internet: URL: http://ftp.gnu.org/non-gnu/cvx/source/feature.1.12.9/cederqvist-1.12.9.p> retrieved on Jan. 24, 2005; pp. 65-74.
English translation of document titled "Exhibits and other documents" submitted Sep. 29, 2006 in Japanese Patent Application No. 2003-551734, pp. 1-5.
English Language Translation of Publication submission of Japanese Patent Application No. 2003-551734 dated Oct. 25, 2006.
English Language Translation of Japanese Kokai Patent Application No. Hei 5[1993]-242174 published Sep. 21, 1993 (filing No. Hei 4[1992]-41727).
English Language Translation of Japanese Kokai Patent Application No. Hei 11[1999]-288428, published Oct. 19, 1999 (filing No. Hei 10[1998]-91372).
English Language Translation of Japanese Kokai Patent Application No. Hei 9[1997]-288690, published Nov. 4, 1997 (filing No. Hei 8[1996]-122462).
English Language Translation of Japanese Kokai Patent Application No. Hei 2[1990]-245865, published Mar. 20, 1989 (filing No. Hei 1[1989]-65906).
English Language Translation of Japanese Public Patent Disclosure Bulletin No. 10105586, dated Apr. 24, 1998 (application 8-25457).
English Language Translation of Japanese Kokai Patent Application No. Hei 4[1992]-362783, published Dec. 15, 1992 (filing No. Hei 3[1991]-137766).
English Language Translation of Japanese Kokai Patent Application No. Hei 9[1997]-212530, published Aug. 15, 1997 (filing No. Hei 8[1996]-17325).
English Language Translation of Japanese Kokai Patent Application No. Hei 5[1993]-073630, published Mar. 6, 1993 (filing No. Hei 3[1991]-233515).
English Language Translation of Japanese Public Patent Disclosure Bulletin No. 08235233, dated Sep. 13, 1996 (application No. 7-38249).
English Language Translation of Japanese Kokai Patent Application No. Hei 2[1990]-056070, published Aug. 20, 1988 (filing No. Sho 63[1998]-205677).
English Language Translation of Japanese Kokai Patent Application No. Hei 7[1995]-175842 published Jul. 14, 1995 (filing No. Hei 5[1993]-345183).
English Language Translation of Japanese Kokai Patent Application No. Hei 4[1992]-293169 published Oct. 16, 1992 (filing No. Hei 3[1991]-57351).
English Language Translation of Japanese Public Patent Disclosure Bulletin No. 0696160, dated Apr. 8, 1994 (application No. 04244646).
English Language Translation of Japanese Public Patent Disclosure Bulletin No. 06203108, dated Jul. 22, 1994 (application No. 5-154).
English Translation of Toshio Hoshi, "e-PAL 2000" Printed Circuit Board CAD/CAM System, Denshi Zairyo [Electronic Parts and Materials], Oct. 2001, pp. 153-156.
English Translation of Yoshiki Koyanagi: Stella Station Multi CAD/CAM System for the Next Generation of Printed Circuit Boards, Denshi Zairyo [Electronic Parts and Materials], Oct. 2000, pp. 96-101.
English translation of Japanese Kokai Patent Application No. Hei 7[1995] - 98726, published Apr. 11, 1995 (filing No. Hei 5[1993]-311532), pp. 6-37.

English translation of Japanese Kokai Patent Application No. Hei 4[1992]-68470, published Mar. 4, 1992 (filing No. Hei 2[1990]-180448).

English translation of Japanese Kokai Patent Application No. Hei 5[1993]-74942, published Mar. 26, 1993 (filing No. Hei 3[1991]-259923).

English translation of Japanese Kokai Patent Application No. Hei 10[1998]-307855, published Nov. 17, 1998 (filing No. Hei 9[1997]-118134).

Translation of Japanese Patent Application No. Hei 2[1990]-48774, published Feb. 19, 1990 (filing No. Sho 63 [1988]-199358).

English language translation of Japanese Public Patent Disclosure Bulletin No. 9-62726, dated Mar. 7, 1997 (application 7-220142).

English translation of an Office Action for JP2003551712 dated May 29, 2007.

Analysis and English Translation of Office Action for JP2003-551712 dated May 29, 2007.

* cited by examiner

PROTECTION BOUNDARIES IN A PARALLEL PRINTED CIRCUIT BOARD DESIGN ENVIRONMENT

CROSS-REFERENCE TO RELATED APPLICATIONS

This application is a continuation-in-part of U.S. patent application Ser. No. 10/780,902, filed Feb. 19, 2004 and titled "Parallel Electronic Design Automation: Shared Simultaneous Editing," which application is a continuation of U.S. patent application Ser. No. 10/269,614, filed Oct. 10, 2002 and also titled "Parallel Electronic Design Automation: Shared Simultaneous Editing" (now U.S. Pat. No. 6,708,313), which application claims the benefit of U.S. Provisional Application Ser. No. 60/341,037, filed Dec. 10, 2001. This application also claims the benefit of U.S. Provisional Application Ser. No. 60/523,697, filed Nov. 21, 2003, titled "A Revolutionary Design Technology." All of said applications are hereby incorporated by reference in their entireties.

COPYRIGHT NOTICE

A portion of the disclosure of this patent document may contain material which is subject to copyright protection. To the extent that it does, the copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright© 2003-2004, Mentor Graphics Corp., All Rights Reserved.

FIELD OF THE INVENTION

This invention relates to the field of electronic design automation tools, and more specifically, to facilitating ease of use, conflict avoidance and exploration of alternative design concepts in a shared printed circuit board design environment.

BACKGROUND OF THE INVENTION

A printed circuit board ("PCB") often begins as a schematic diagram by which an electrical engineer describes an electronic circuit as a logical diagram of symbolic representations. The schematic may then be used to lay out various electronic components, and the connections (e.g., netlines, routes, traces) between those components may be routed. Ultimately, a PCB design is created and data for the PCB design can be electronically stored. That design data can be used to generate artwork corresponding to a pattern of components and connections between those components. The artwork, in turn, can be used with photographic imaging techniques to manufacture the PCB.

Many users may be involved during the layout process. Traditionally, this has been accomplished via a design splitting mechanism whereby each user can check out a corresponding (assigned) piece of the design to make edits to the PCB layout. FIG. 1 is a block diagram that illustrates a prior art system for designing a PCB. The system comprises a plurality of clients 102, 104, 106 and a server 100, where the server 100 comprises a database 108 to store a master PCB design 116 (hereinafter "master design"), and each of the clients 102, 104, 106 enables users connected thereto to request edits to the master design 116. As used herein, a master design refers to a PCB design which can be edited by the users. Under the illustrated prior art, each user opens a unique piece 110, 112, 114 of the master design 116 to work on. A user may open a corresponding piece 110, 112, 114 of the design 116 from the database 108 and make edits to the corresponding piece 110, 112, 114 of the design 116. However, the user cannot see what edits are being made to the master design 116 by other users, and how edits to the other areas of the master design 116 affect the user's corresponding area. For example, a user on client 102 edits and only sees piece 110 of the master design; a user on client 104 edits and only sees piece 112 of the master design; and a user on client 106 edits and only sees piece 114 of the master design. Upon completion, or at the user's request, the corresponding piece 110, 112, 114 may be checked back into the database 108. At a later time, any of the users can check out a corresponding piece 110, 112, 114 of the master design 116 to see how the compiled, totality of edits made by all users up to that point affect the user's corresponding piece.

Using the above-described approach, a user is limited to viewing only areas of the design that are opened by that user. Consequently, the user cannot see edits that are made to the rest of the board while the user's edits are being made. There remains a need for systems and methods whereby multiple users can simultaneously edit the same portions of a PCB design, but can also prevent conflicts between the users.

As a related matter, it is often useful for a PCB designer to experiment with various alternative arrangements for electronic components and interconnections between those components. In particular, the designer may wish to make changes to a copy of PCB design data without actually editing a master design. After the designer adds and/or moves components, routes various alternative connections between those components and/or performs various other editing tasks, the designer can determine if the resulting design changes are satisfactory. If so, those changes can then be made to the master design. If not, the integrity of the master design has not been jeopardized by numerous edits which must be reversed. It would thus be useful if, in a system in which multiple users may simultaneously edit the same portion(s) of a PCB design, a user could delineate portions of the design in which that user may experiment with various design changes before those changes are incorporated in a master design.

SUMMARY OF THE INVENTION

In at least some embodiments, the invention includes a method for editing a printed circuit board (PCB) design. Design data is graphically displayable at multiple clients and can be simultaneously edited at those clients. In certain embodiments, a user at one of the clients may protect a portion of the design from editing by one or more users at one of the other clients. In further embodiments, the user at the client protecting a design portion may use that protected portion to explore alternative design changes. These alternative changes are not made to a master design unless requested by the protecting user. Additional embodiments include machine readable media having instructions for carrying out methods of these and other embodiments. These and other features and advantages of the present invention will be readily apparent and fully understood from the following detailed description of preferred embodiments, taken in connection with the appended drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

In one aspect of the invention is a method for allowing a user to edit a PCB design concurrently with allowing the user to view edits to the PCB design by other users. Generally, the method displays a PCB design to a plurality of users. While a first user makes edits to an arbitrary section of the PCB design, a second user makes edits to an arbitrary section of the PCB design while preserving the integrity of the master design. In one embodiment of the invention, arbitrary sections may overlap, allowing each user to edit shared areas of the master design. In another embodiment of the invention, arbitrary sections are mutually exclusive, such that each user edits unshared, exclusive areas of the master design.

The present invention includes various operations, which will be described below. The operations of the present invention may be performed by hardware components or may be embodied in machine-executable instructions, which may be used to cause a general-purpose or special-purpose processor or logic circuits programmed with the instructions to perform the operations. Alternatively, the operations may be performed by a combination of hardware and software.

The present invention may be provided as a computer program product which may include a machine-readable medium having stored thereon instructions which may be used to program a computer (or other electronic devices) to perform a process according to the present invention. The machine-readable medium may include, but is not limited to, floppy diskettes, optical disks, CD-ROMs (Compact Disc-Read Only Memories), and magneto-optical disks, ROMs (Read Only Memories), RAMs (Random Access Memories), EPROMs (Erasable Programmable Read Only Memories), EEPROMs (Electromagnetic Erasable Programmable Read Only Memories), magnetic or optical cards, flash memory, or other type of media/machine-readable medium suitable for storing electronic instructions.

Moreover, the present invention may also be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection). Accordingly, herein, a carrier wave shall be regarded as comprising a machine-readable medium.

Figure 1:
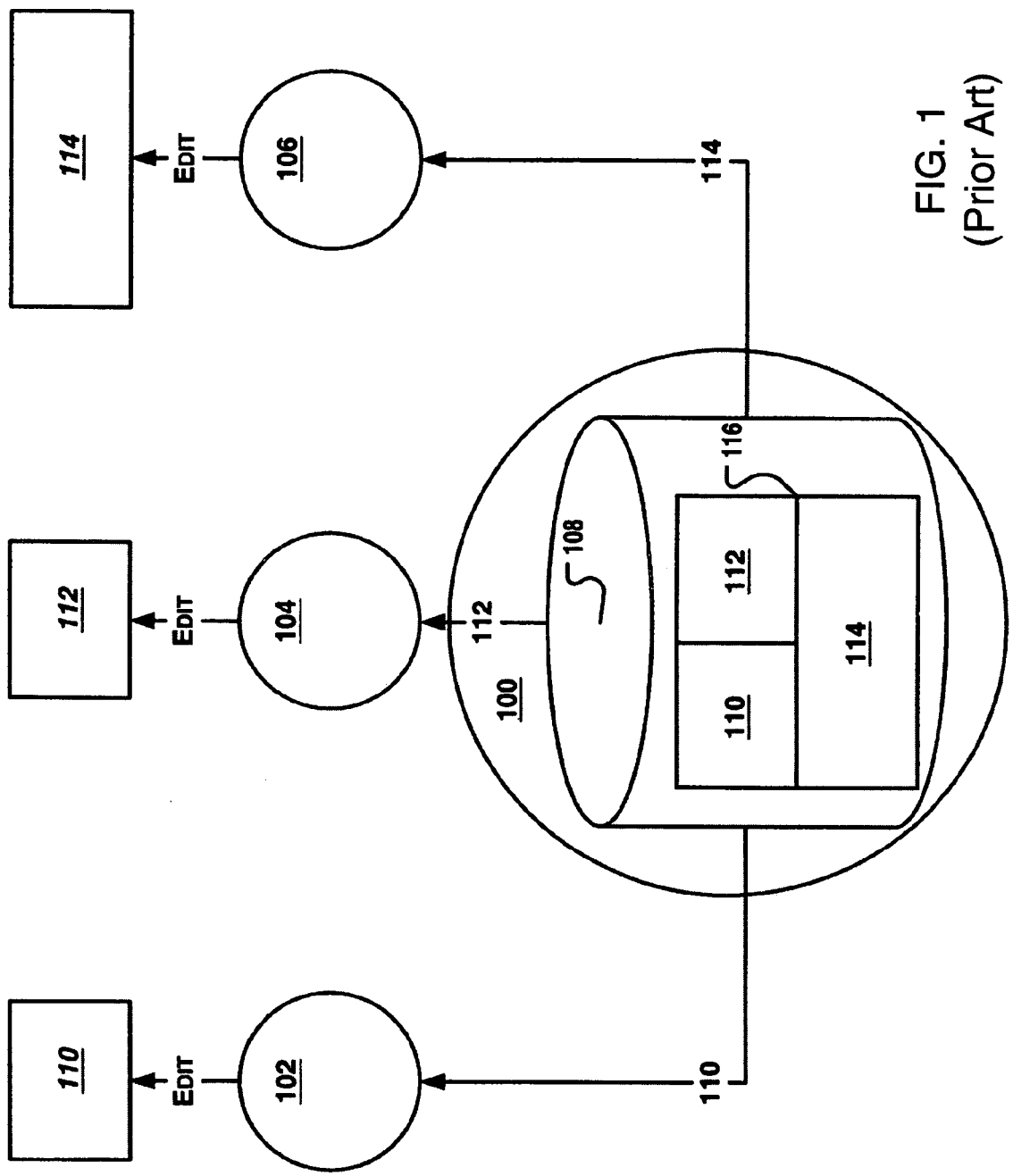
FIG. 1 is a block diagram illustrating a prior art system for PCB design, where individual sections of a master design are checked out by users.
Figure 2:
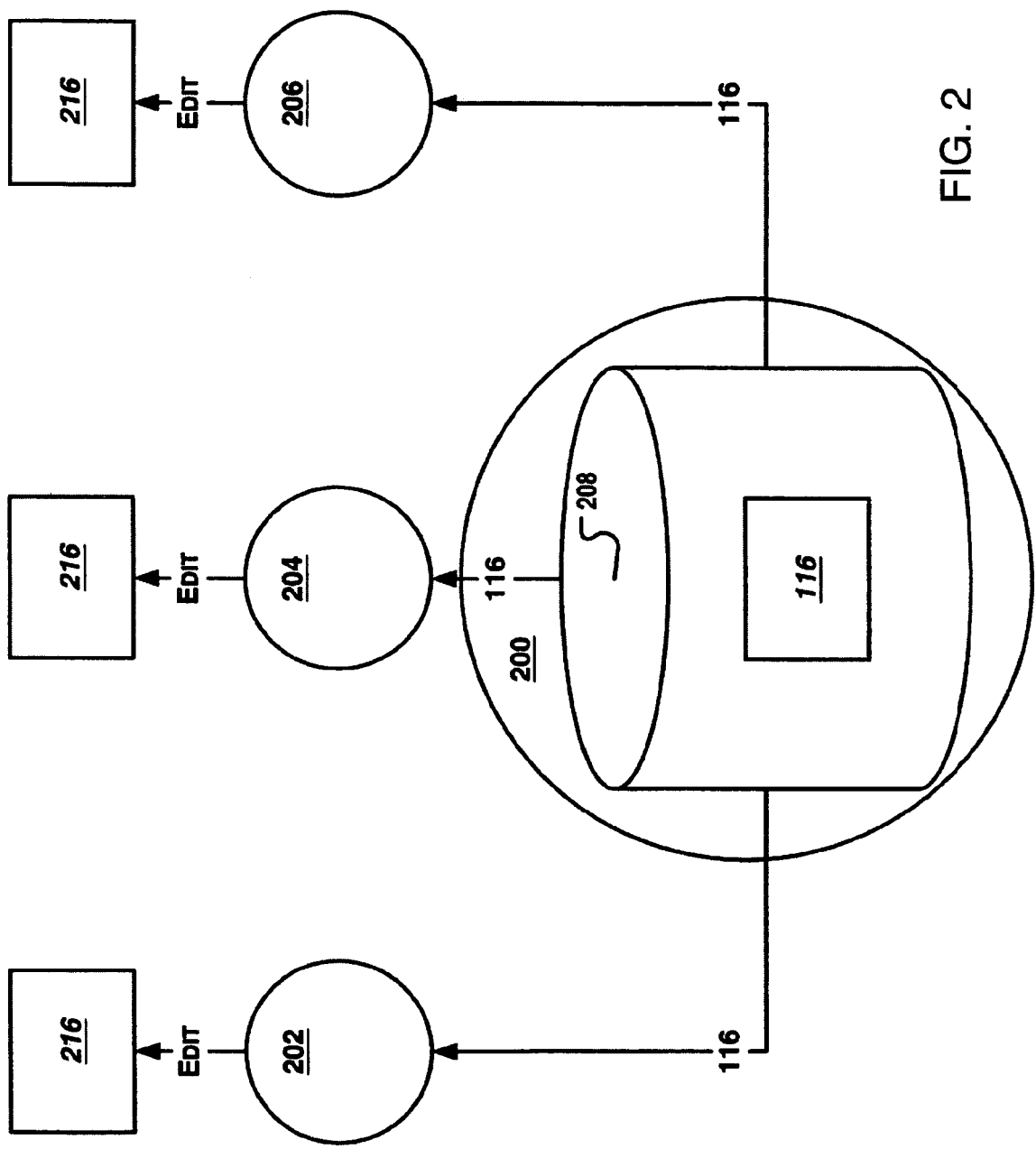
FIG. 2 is a block diagram illustrating a general embodiment of the invention, where users are given parallel access to a master design for editing.

FIG. 2 is a block diagram that illustrates a system for parallel PCB design in accordance with general embodiments of the invention. It comprises a plurality of clients 202, 204, 206, a server 200, where the server 200 has a database 208 for maintaining a master design 116.

Each client 202, 204, 206 enables users to request edits to the master design 116 in parallel with one another while viewing edits made to the master design 116 by other users. Master design 116 comprises the version on the server 200 database 208 which incorporates edit requests from clients that are accepted by the server 200, and may also be referred to as the compiled master design. Master design 216 comprises the version that is edited by a user on a given client 202, 204, 206.

When a PCB design is displayed (i.e., master design 216), it may comprise the entire PCB design, or it may comprise a partial PCB design. For instance, the master design 116 may be distributed amongst several user groups, and embodiments of the invention may be applicable to each user group, such that for a given user group, only their sections are displayed, thereby displaying only a partial PCB design. However, the sections displayed for that user group may comprise shared and exclusive areas as described herein.

A user on client 206, for example, may request edits to the master design 116, and the edit requests are submitted to the server 200. The server 200 processes the edit requests and either accepts the edit requests or rejects them. Rejected edit requests are reported back to the requesting client 206. Accepted edit requests are applied to the master design 116. Clients 202, 204, 206 can then be synchronized with master design 116.

In embodiments of the invention, parallel PCB design gives users the ability to view a compiled master design 116 while requesting edits to the master design 116. In one embodiment, one user may simultaneously edit shared areas of the master design with another user while viewing the master design 116 (shared PCB design). In another embodiment, one user may simultaneously edit unshared, exclusive areas of the master design 116 (distributed PCB design) with another user while viewing the master design 116.

An edit request may comprise a list of one or more objects and corresponding commands made by the particular user. Objects include routes, components, traces, vias, text, and drawing objects, for example; and commands include move left, move right, delete, or add, for example.

Figure 3:
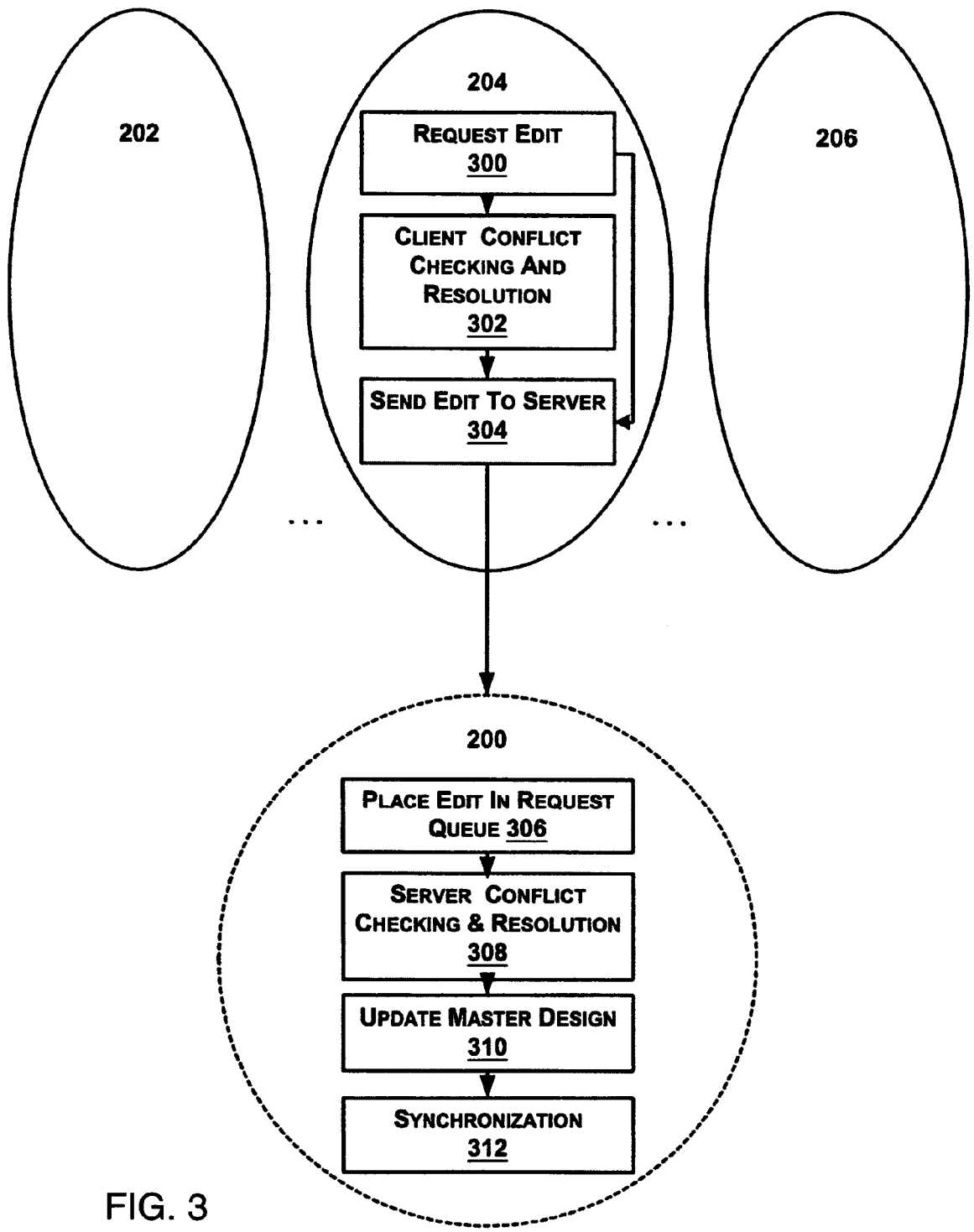
FIG. 3 is an entity diagram illustrating a general embodiment of the invention.

FIG. 3 illustrates an entity diagram. It comprises n clients 202, 204, and 206, and a server 200. A compiled master design is presented to the users. A user connected to a given client 204 makes an edit request 300 to edit the master design. If the client 204 has resources for conflict checking and resolution 302 (to be discussed), then the task is performed by the client. If client conflict checking and resolution passes, or if client conflict checking and resolution does not exist, then the edit request 300 is submitted to the server 304. If client conflict checking and resolution does not pass, then the edit request is rejected and another edit request 300 may be made.

Once an edit request 300 is submitted to the server 304, the edit request 300 is placed in a request queue 306 of the server. The request queue may comprise a FIFO (first-in-first-out) queue where edit requests submitted first are processed first; or a priority queue, where certain edit requests (i.e., types of requests, or requests from certain clients) are given priority over other edit requests, for example. When the edit request is eventually taken off the request queue, server conflict checking and resolution 308 (to be discussed) are performed on the edit request. If server conflict checking and resolution passes, then the edit is accepted and the master design is updated 310. The clients can then be synchronized with the master design 312.

The following comprise examples of how edits can be detected:

When a user moves an object, he selects it, moves it, and then releases it. An edit is detected once the object has been released.

When a user deletes an object, he selects it, and selects a delete command. An edit is detected when the delete command is selected. (The delete command may embody many variations. For example, a delete button may be selected, or the object to be deleted may be placed in a recycle bin.)

When a user adds an object, an object to be added is selected, placed on the master design, and then released. An edit is detected when the object to be added is released.

Shared PCB Design

Figure 4:
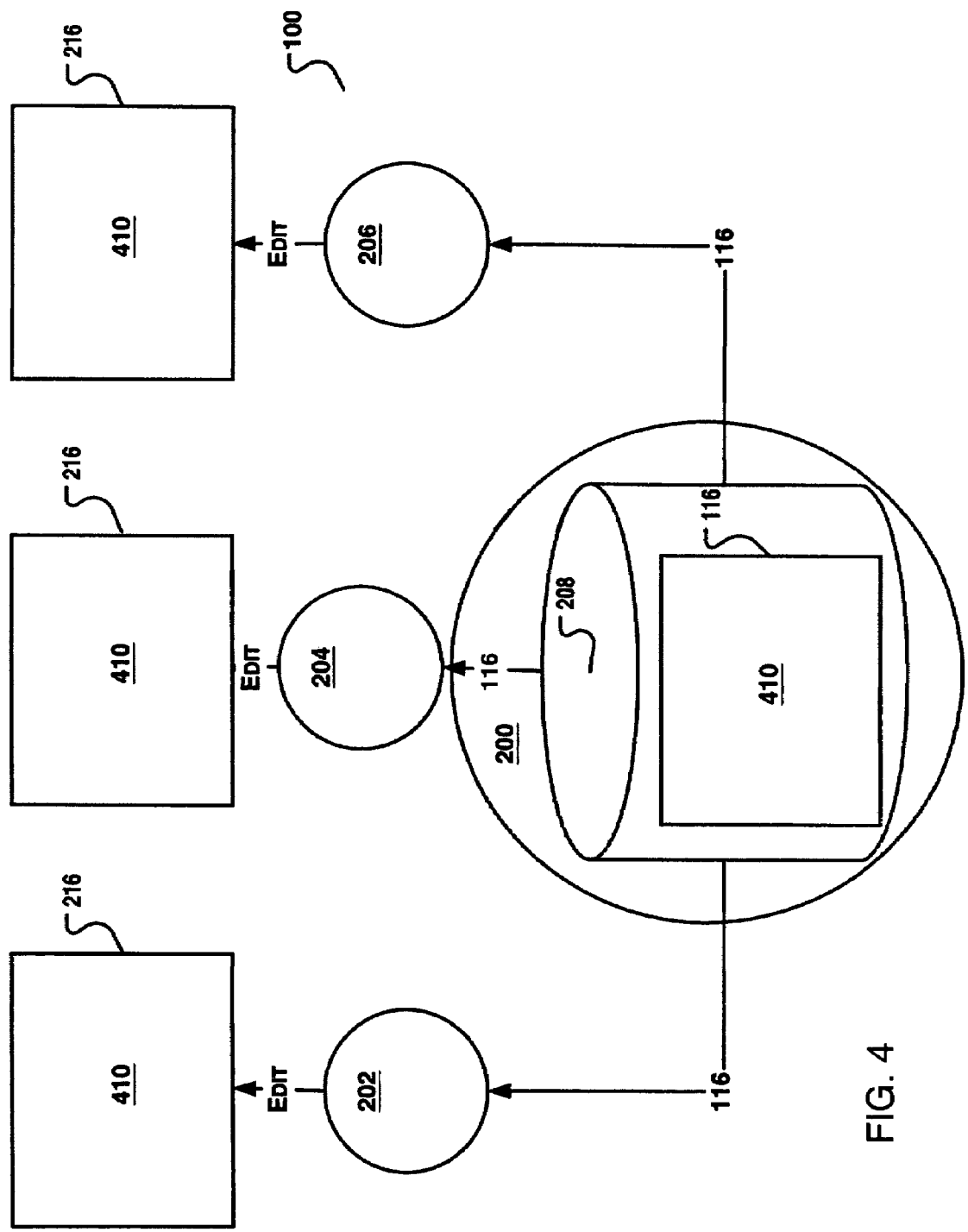
FIG. 4 is a block diagram illustrating a first embodiment of the invention, where parallel access is implemented by giving users concurrent editing access to shared areas of a master design.

In one embodiment of the invention is a shared editing system, as illustrated in FIG. 4, where a plurality of users 202, 204, 206 may simultaneously edit shared area 410 of a PCB design 116, giving each of the users shared access to the PCB design. In embodiments of the invention, shared areas comprise areas of the master design that can be accessed and edited by multiple users. On the other hand, exclusive areas are partitioned and assigned to individual users. Exclusive areas are discussed in further detail in the section entitled "Distributed PCB Design".

For purposes of illustration, it is assumed that the entire board comprises shared areas such that each of the users on the clients 202, 204, 206 can simultaneously edit and view objects in the entire master design 116, subject to access rights, discussed below. It is also contemplated that shared areas may comprise a subset of areas on a master design 116, such that the master design 116 comprises both shared and exclusive areas. In this latter scenario, edits to the master design 116 in exclusive areas are validated by a corresponding client conflict checking and resolution module; and edits to the master design 116 in shared areas may be validated by a corresponding client conflict checking and resolution module, a server conflict checking and resolution module, or both.

Figure 5:
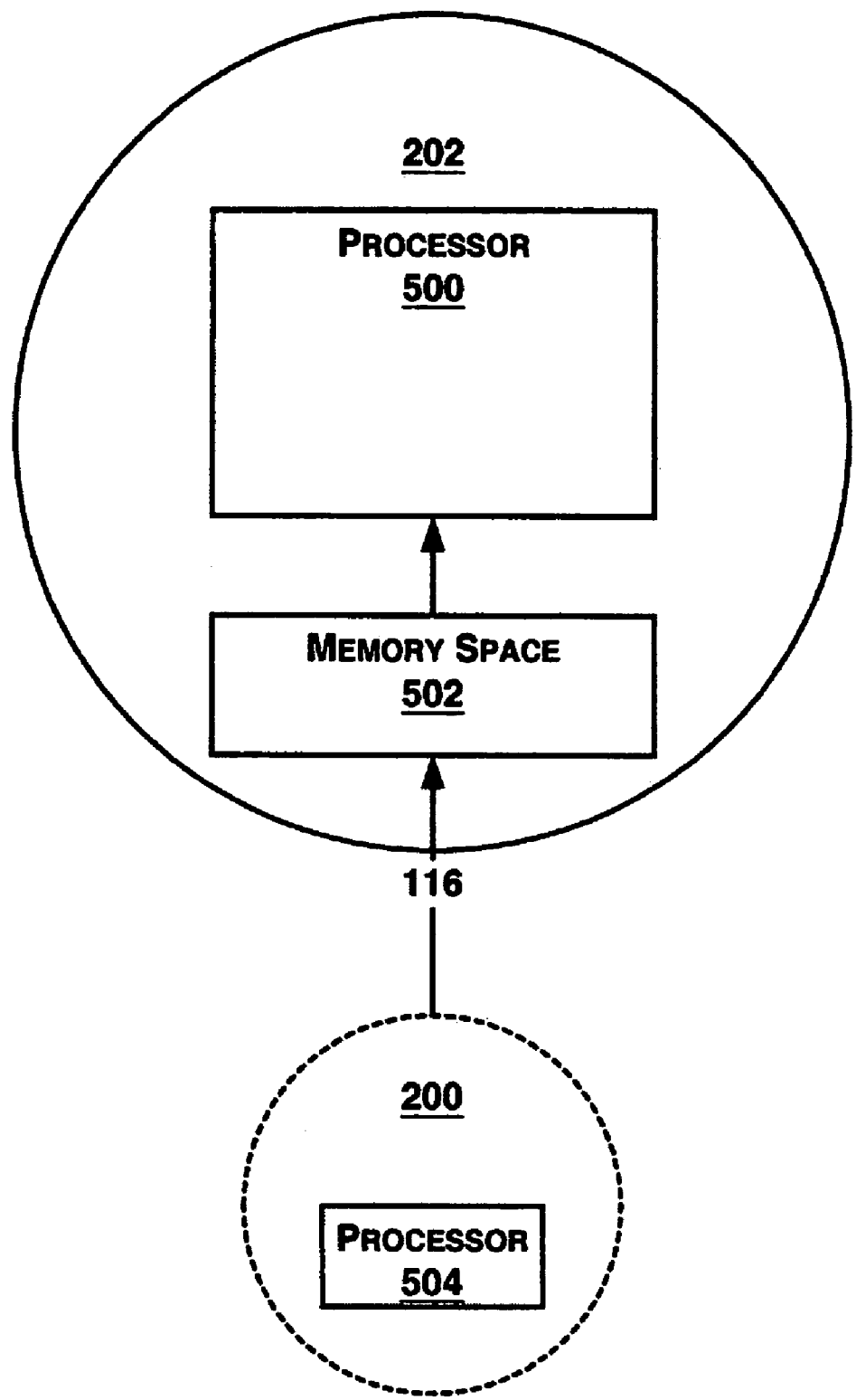
FIG. 5 is an entity diagram illustrating interaction between a client and a server in accordance with general embodiments of the invention.

In FIG. 5, a client 202 (only one shown) corresponds to a given user and comprises a processor 500 and an optional memory space 502. The server 200 comprises a processor 504 as well. While illustrated as a one-to-one client-server, and user-client relationship, it should be understood by one of ordinary skill in the art that the configuration is not to be so limited. It should be understood that any single client is merely a portal that allows a user to edit the master design 116 simultaneously with other users. Furthermore, the server 200 should be understood as an appliance for coordinating and managing the edits to the master design 116.

In one embodiment, the master design 216 comprises master design 116 on a client, such as on a thin client (i.e., client having minimal processing resources), where all edit requests are submitted to the server 200. In this embodiment, the server 200 performs all conflict checking and resolution operations to determine whether the edit requests are acceptable, to be discussed.

In another embodiment, master design 216 comprises a copy of the master design 116 in a client's memory space. In this embodiment, conflict checking and resolution operations may be performed by a processor 504 on the server 200 alone, on a processor 500 by the client 202 alone, or may be distributed in various proportions between the respective processors of a given client 202, 204, 206, and the server 200. These are described in more detail below.

Access Rights

In general embodiments of the invention, each user has access to the same aspects of the master design as any other user, subject to assignment restrictions (discussed below in "Distributed PCB Design"). In one embodiment, all users have the same access rights. For example, a first user may request edits to the same objects and commands as a second user. In another embodiment, access rights of each user may differ. For example, a first user may only request edits to components, and a second user may only request edits to routes.

Conflict Checking and Resolution

When an edit request is received, conflict checking and resolution operations are performed. Conflict checking comprises checking to prevent edits that violate one or more design rules. Design rules ensure that the design adheres to a predetermined set of rules in order to minimize the probability of fabrication defects. A design rule checker may check for spacing violations, geometry violations, and connectivity violations, for example. For example, when two traces are placed next to each other that are closer than a spacing rule, a design rule violation occurs.

Conflict resolution comprises detecting edits that may conflict, but which may be resolved. For example, if two traces are too close and violate a design rule, then one trace can be moved to resolve the conflict.

Figure 6:
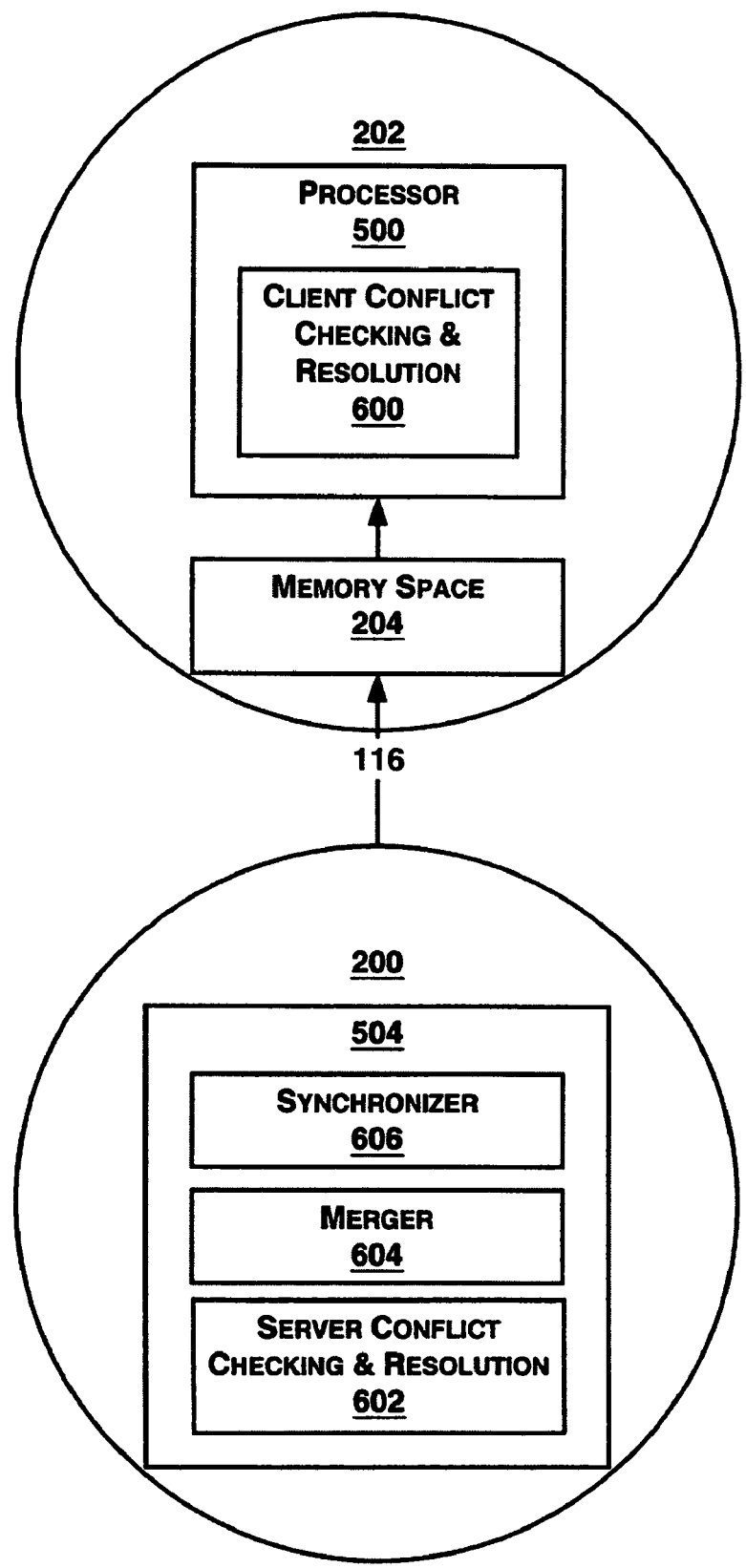
FIG. 6 is an entity diagram illustrating interaction between a client and a server in accordance with a first embodiment of the invention.

As illustrated in FIG. 6, client conflict checking and resolution and server conflict checking and resolution may coexist, or they may exist in isolation. When they coexist, a client conflict checker and resolution module 600 of a client 202 determines if the master design 216 on the client has any conflicts. If there is a conflict, it is determined if the conflict can be resolved.

If the conflict can be resolved, or if there are no conflicts, then the client conflict checker and resolution module 600 sends the edit request to the server conflict checker and resolution module 602 of the server 200 to determine if any conflicts exist with the master design 116 on the server.

If conflicts exist, then the server conflict resolution module 602 may determine if the conflicts may be resolved. If no conflicts exist, then the edit requests are accepted, and a merger unit 604 of the server 200 applies the edit requests into the master design data structure.

A synchronizer 606 of the server 200 then synchronizes the one or more clients 202, 204, 206 with the compiled master design 116. Synchronizing may comprise, for example, sending master design 116 to a single client upon request from the client; broadcasting master design 116 to all or multiple clients upon request from multiple clients; automatically swapping out a client copy of the master design data structure 216 on each of the clients 202, 204, 206 for the updated master design data structure 116 on the server 200 upon updating the master design; or automatically updating the clients' 202, 204, 206 displays upon updating the master design 116. Of course, these examples do not comprise an exhaustive list.

When conflict checking and resolution exist in isolation, either the server performs all conflict checking and resolution; or each client performs all conflict checking and resolution. The server may perform all conflict checking and resolution operations when, for example, clients are thin clients (i.e., clients having minimal processing resources), and the master design 216 on the client comprises master design 116, where edit requests are submitted to the server 200. Clients may perform all conflict checking and resolution when, for example, a master design is partitioned and assigned to individual users such that no inter-client conflicts arise during editing (to be discussed in Distributed PCB Design). In this latter scenario, where edits are made in their respective exclusive areas, if any conflicts still exist after those edits are made (residual conflicts), the server may perform conflict checking and resolution operations. However, this is not necessary, as the residual conflicts may be taken care of after the edits have been applied.

When a server performs conflict checking and resolution, in cooperation with the client, or in isolation, the server may implement optimization functions to minimize its workload. For example, it may keep track of which client made the previous edit request that was merged so that if the next edit request comes from the same client, the server knows that it can eliminate certain conflict checking and resolution functions.

Conflict Prevention

Figure 7:
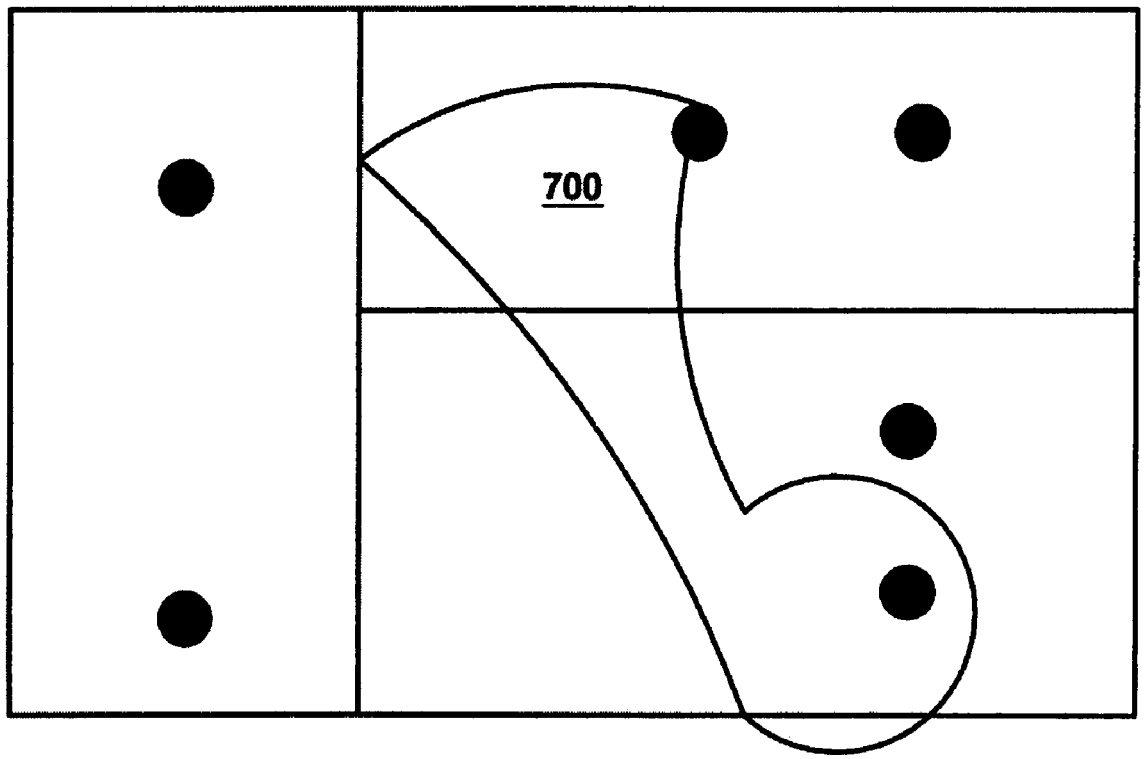
FIG. 7 is a block diagram illustrating a first conflict prevention mechanism.

To avoid conflicts from occurring in the first place, a number of conflict prevention mechanisms may be employed. One mechanism that can be used to prevent conflicts is the use of protection boundaries as illustrated in FIG. 7. A protection boundary 700 allows a user to draw a protection border around the user's workspace that temporarily reserves the area for the particular user. The protection border is broadcasted to all clients, and enables a user to edit the master design without encountering conflicts. The protection border may be removed at the user's request. If another user attempts to edit in an area contained in a protected border, a conflict checker prevents it and reports it as an error to the client on which the edit is being attempted.

Figure 8:
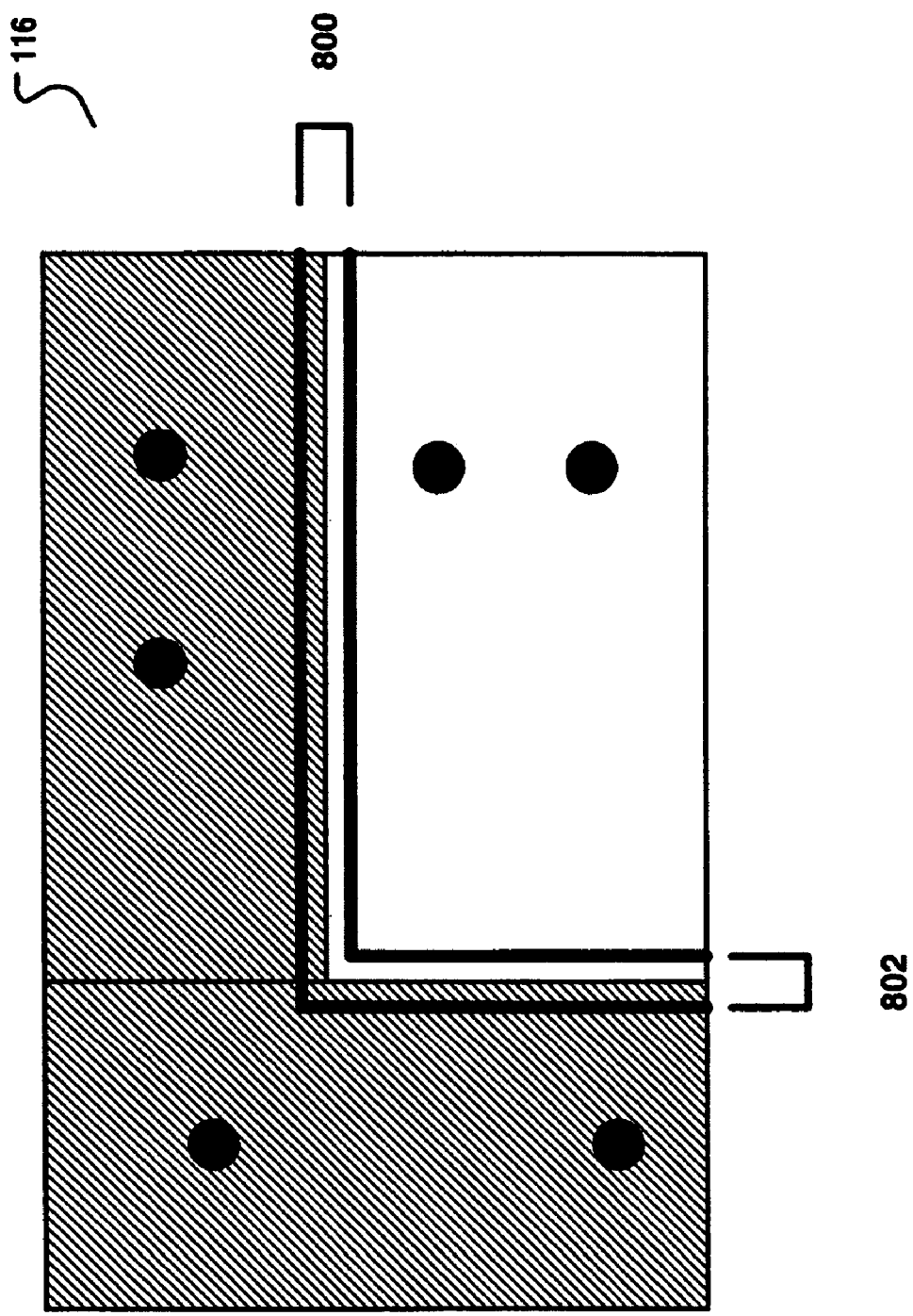
FIG. 8 is a block diagram illustrating a second conflict prevention mechanism.

As illustrated in FIG. 8, another mechanism for preventing conflicts is the use of force field widths 800, 802 along the boundaries of a user's working area to automatically provide a reasonable clearance around the working area. In one embodiment, the user's working area comprises the cursor, where a force field width is applied to the area around the cursor. In other embodiments, the working area may comprise an object closest to the cursor, where a force field width is applied to the area around the object. If another user attempts to edit within the boundaries of a working area protected by force fields, the conflict checker prevents it and reports it as an error to the client on which the edit is being attempted.

Another mechanism that can be used for conflict prevention is object locking. Object locking entails marking an object as reserved for the client that performs the locking operation and not editable by other clients. In some embodiments, a client may lock an object and limit (by assigning access rights) the other clients which may edit that object. Still another mechanism that can be used for conflict prevention is the assignment of netlines to autorouters. Assigning netlines to autorouters prevents one autorouter from routing the same netline differently.

Distributed PCB Design

Figure 9:
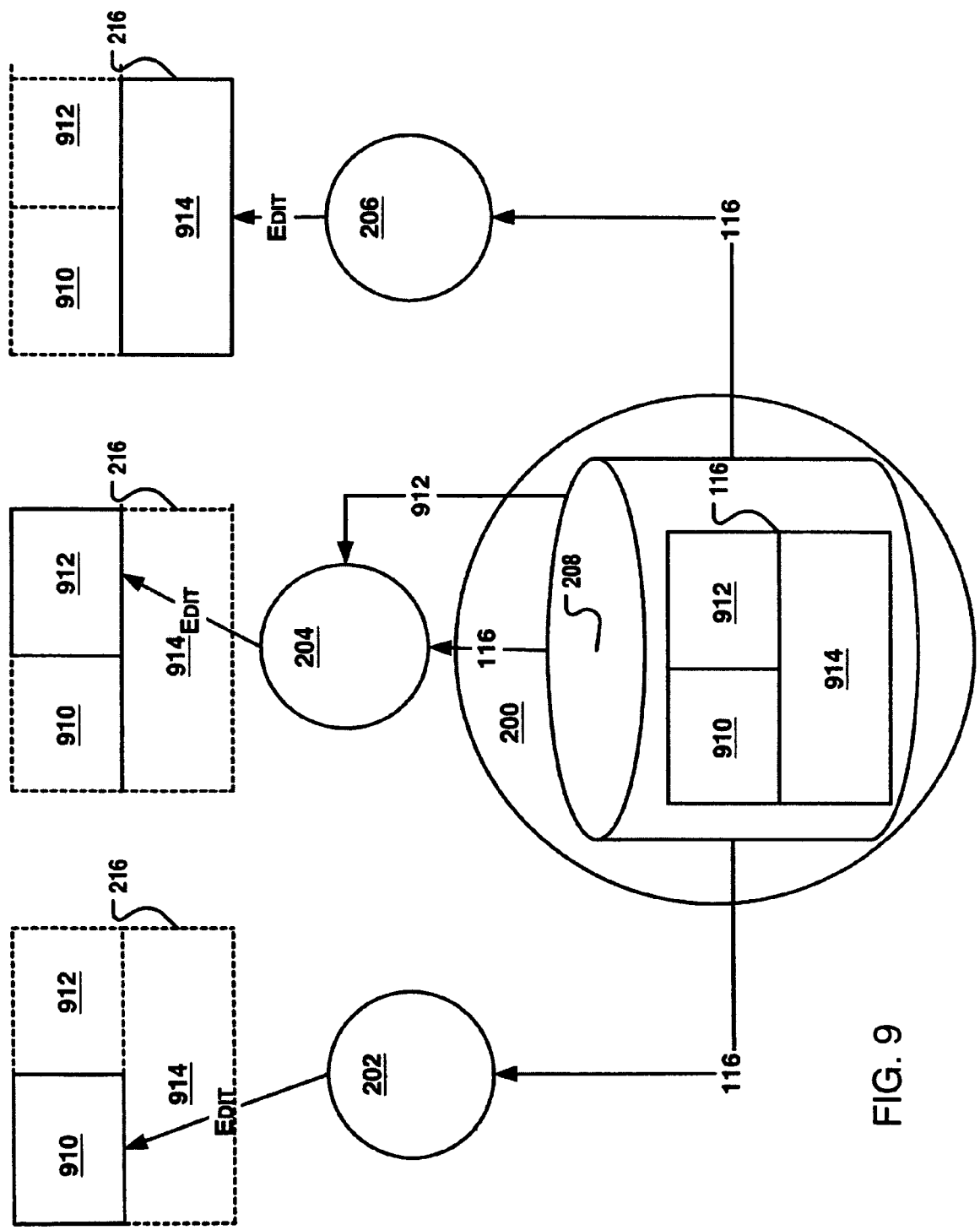
FIG. 9 is a block diagram illustrating a second embodiment of the invention, where parallel access is implemented by giving users editing access to corresponding areas of a master design, and read-only access to other areas of the master design.

FIG. 9 is a block diagram of a distributed editing system in accordance with another embodiment of the invention. The system comprises a plurality of clients 202, 204, 206, and a server 200 having a database 208 to store the master design 116. The master design comprises exclusive areas 910, 912, 914, where each exclusive area 910, 912, 914 may be viewed by all users, but edited by a single user.

Like prior art systems, each user is assigned a unique piece 910, 912, 914 of the master design 116 to work on. However, unlike prior art systems, a user can view the edits to the other pieces of the design being performed by other users concurrently with the user's editing session. For example, exclusive area 910 may correspond to a user on client 202, such that the user on client 202 may edit exclusive area 910. User on client 202 is able to edit exclusive area 910, and is also able to view exclusive areas 912, 914 to view the compiled master design.

Partitioning

Partitioning is the process whereby a design is segregated into a plurality of areas. Partitioned areas may then be assigned to users, such that only an assigned user may edit that area. An exclusive area, with respect to a given user who is assigned to the exclusive area, can only be edited by the given user. The exclusive area with respect to any other user can only be viewed (i.e., is read-only) by other users. In certain embodiments, access rights can be defined so that a portion of a design is exclusive as to a group of users (e.g., the exclusive area is a shared area as to that user group). In other words, certain users may edit within that portion and other users may not The area boundaries may be arbitrary, and are not bound to the schematic boundaries. Partitioning may be performed by specific drawing tools that create polygons and can assign attributes such as a name, an owner, etc. to each exclusive area.

Figure 10:
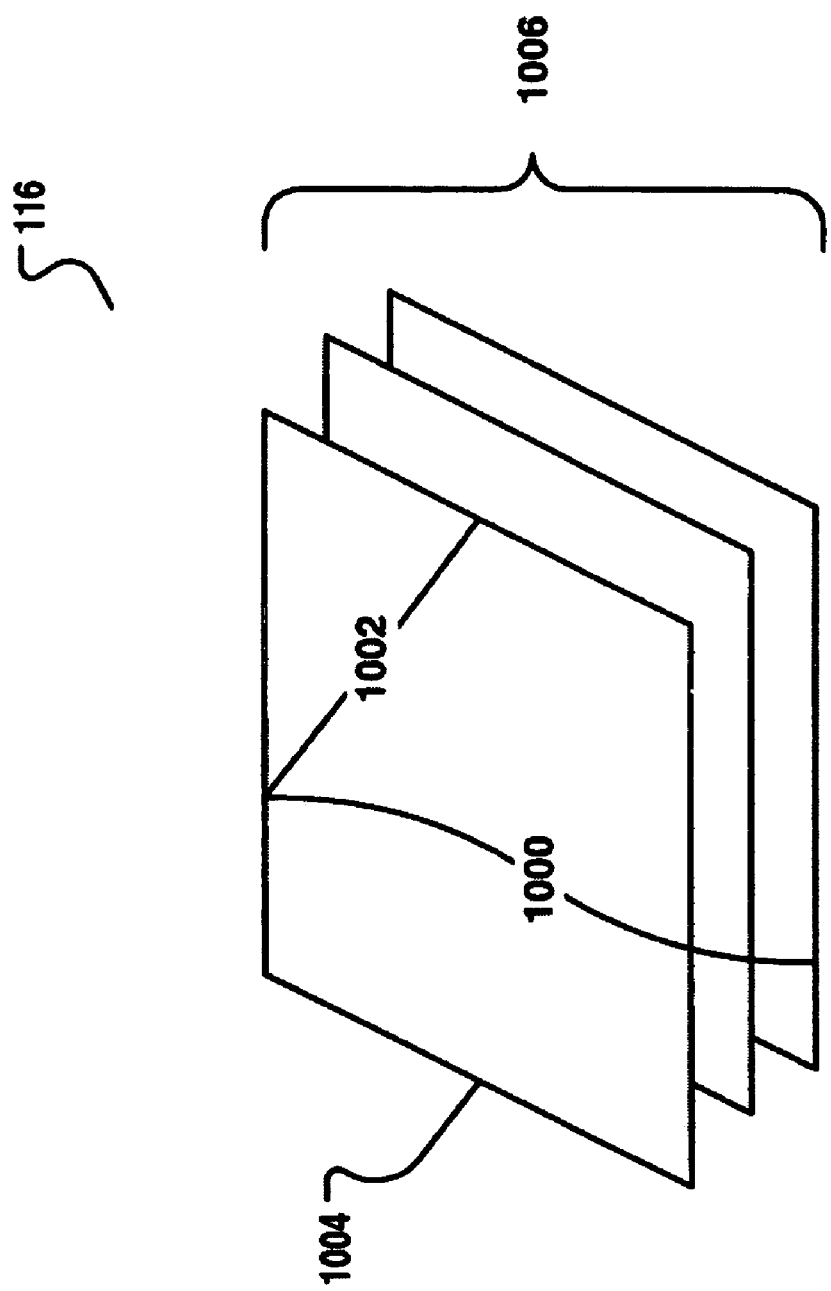
FIG. 10 is a block diagram illustrating partitioning.

In embodiments of the invention, an owner of a design partitions a design into a plurality of sections. For example, as illustrated in FIG. 10, arcs 1000 and lines 1002 may be used to partition a single layer 1004 of the design 116, or even multiple layers 1006 of the design 116. Sections may be defined by specifying a type of area (i.e., circle, rectangle, polygon); assigning one or more layers to the area; and assigning the section. Each section is then available for editing by a single user. An owner of a design may also be a user.

When a section is assigned to a user or group of users, the section becomes an exclusive area. An exclusive area is not available for editing by users not within the assignee group, but is available for viewing by those non-assignee users. An exclusive area may be explicitly assigned whereby the owner of the design specifically assigns a given area to a specific user, or an exclusive area may be implicitly assigned whereby any area that is not explicitly assigned is assigned to the owner of the design by default. Alternatively, each area may be assigned an arbitrary name, and users may reserve areas by checking out exclusive areas on demand.

For purposes of illustration, it is assumed that the whole board is exclusive such that users on the clients 202, 204, 206 can simultaneously edit in assigned areas while viewing the compiled master design 116, subject to access rights, discussed supra. It is also contemplated that exclusive areas may comprise a subset of areas on a master design 116, such that the master design 116 comprises shared and exclusive areas. In this latter scenario, edits to the master design 116 in exclusive areas are validated by a corresponding client conflict checking and resolution module; and edits to the master design 116 in shared areas may be validated by a corresponding client conflict checking and resolution module, a server conflict checking and resolution module, or both.

Editing

Figure 11:
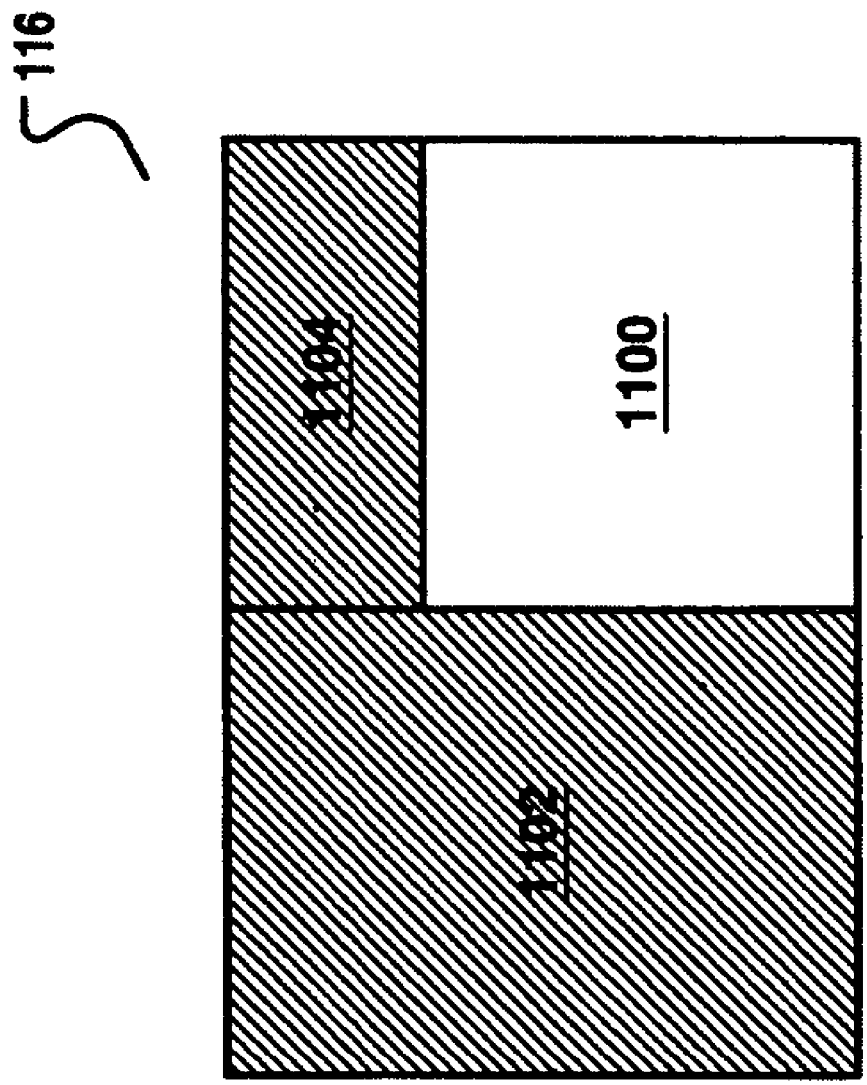
FIG. 11 is a block diagram illustrating a partitioned master design.

As illustrated in FIG. 11, when a user opens a design 116, all sections corresponding to the user 1100 (i.e., exclusive areas that are assigned to or checked out by the user), as well as shared areas, if any, are available to the user for editing, and all other non-corresponding, exclusive areas 1102, 1104 are available for viewing. In embodiments of the invention, the user may be given an option to display only the parts and routes inside the exclusive areas for the specified user. Other items such as PCB objects, drawing objects, and netlines can be displayed normally.

Any objects inside a corresponding exclusive area are available for editing, and any objects outside of a corresponding exclusive area are locked and not available for editing, but are read-only. Objects include but are not limited to routes, components, traces, vias, text, and drawing objects, for example.

Placement Rules

Placement and clearance rules help prevent conflicts that may arise during design of a section. For example, since exclusive areas may have layer restrictions, it is possible for a component, a via, a thruhole pin, or a part to exist in multiple exclusive areas. Any object that exists in multiple areas should be locked. An object that would traverse multiple areas (by existing on multiple layers that are assigned to different users) should be prevented from being added.

Figure 12:
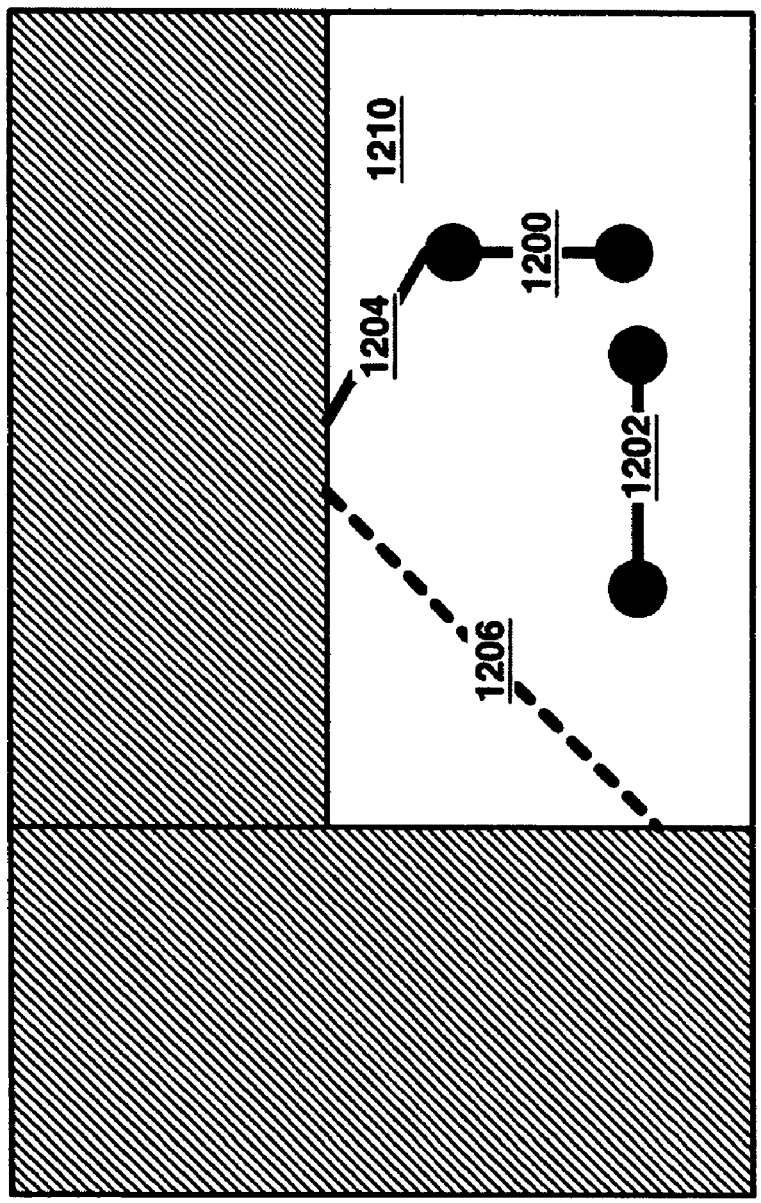
FIG. 12 is a block diagram illustrating netline connectivity when partitioning is implemented.

Furthermore, as illustrated in FIG. 12 (assuming area 1210 is an exclusive area), netlines 1200, 1202 that start inside an exclusive area, and finish inside an exclusive area may be completely routed; netlines 1204 that start inside an exclusive area, but that finish outside the exclusive area may be routed to the edge of the exclusive area. Once the netline is routed to the edge of one exclusive area, the owner of the adjacent exclusive area (or any user, if it is a shared area) may continue routing the netline in their own area. Netlines 1206 that do not start or end in an exclusive area may be restricted from routing, or may be routed with limitations. In this example, netline 1206 may be routed if its endpoints are on the edge of the exclusive area.

Figure 13:
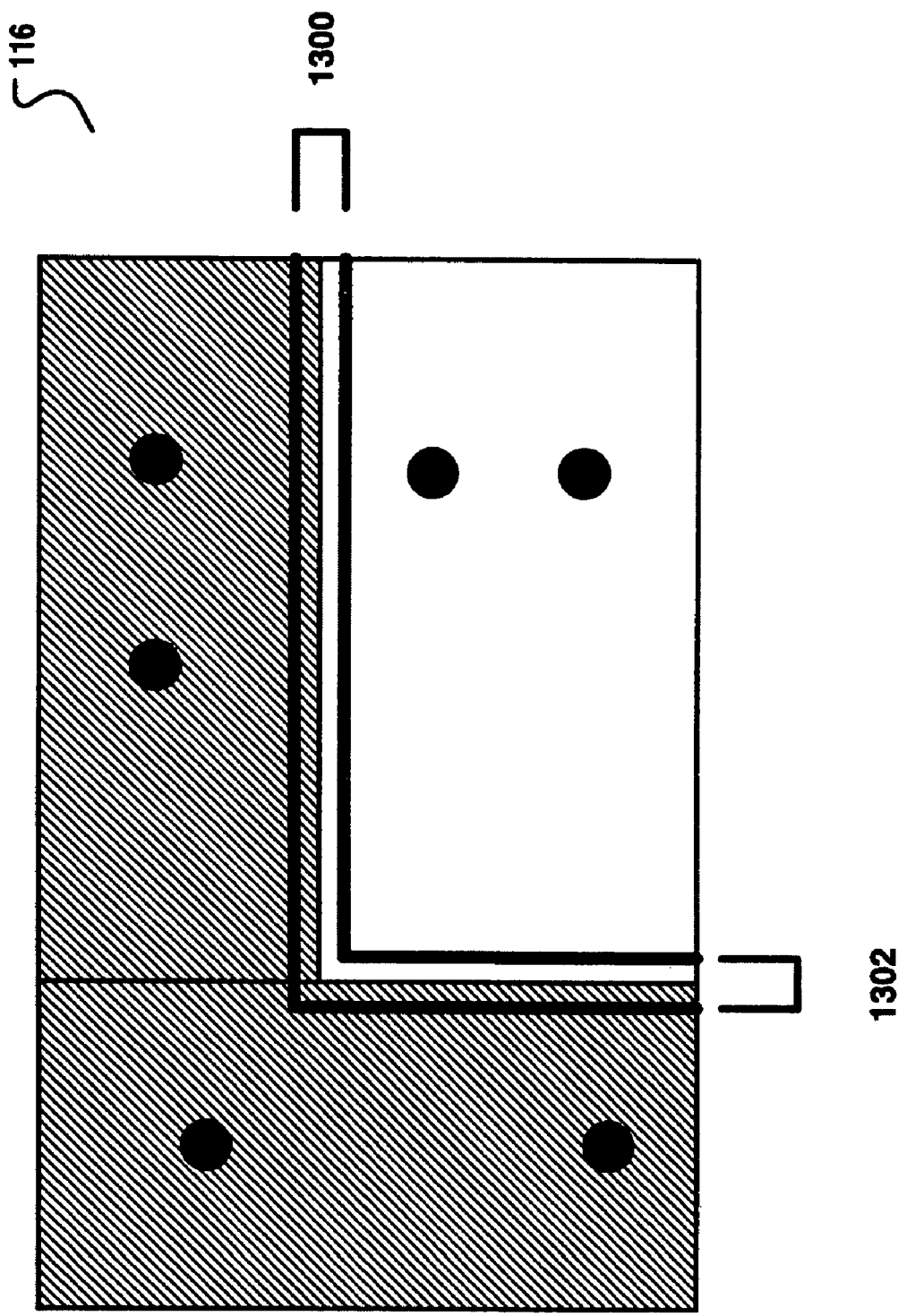
FIG. 13 is a block diagram illustrating the use of force field widths in netline connectivity.

Spacing violations may occur when traces are placed too closely to one another. (See Conflict Checking and Resolution, discussed supra.) Spacing violations are likely to occur along the boundary of two sections, or within an exclusive area. As illustrated in FIG. 13, one way to deal with spacing violations that occur along the boundary of two sections, is to allow force field widths 1300, 1302 (discussed, supra) along the boundaries. Force field widths automatically provide a reasonable clearance between objects along the boundaries, and allow users to design to the edge of an exclusive area without facing potential spacing violations.

There are various other possibilities for placement and clearance rules that are well known in the art and are not further discussed herein. The examples provided are for illustrative purposes only and are not intended to be limiting on embodiments of the invention.

Flowcharts

Figure 14:
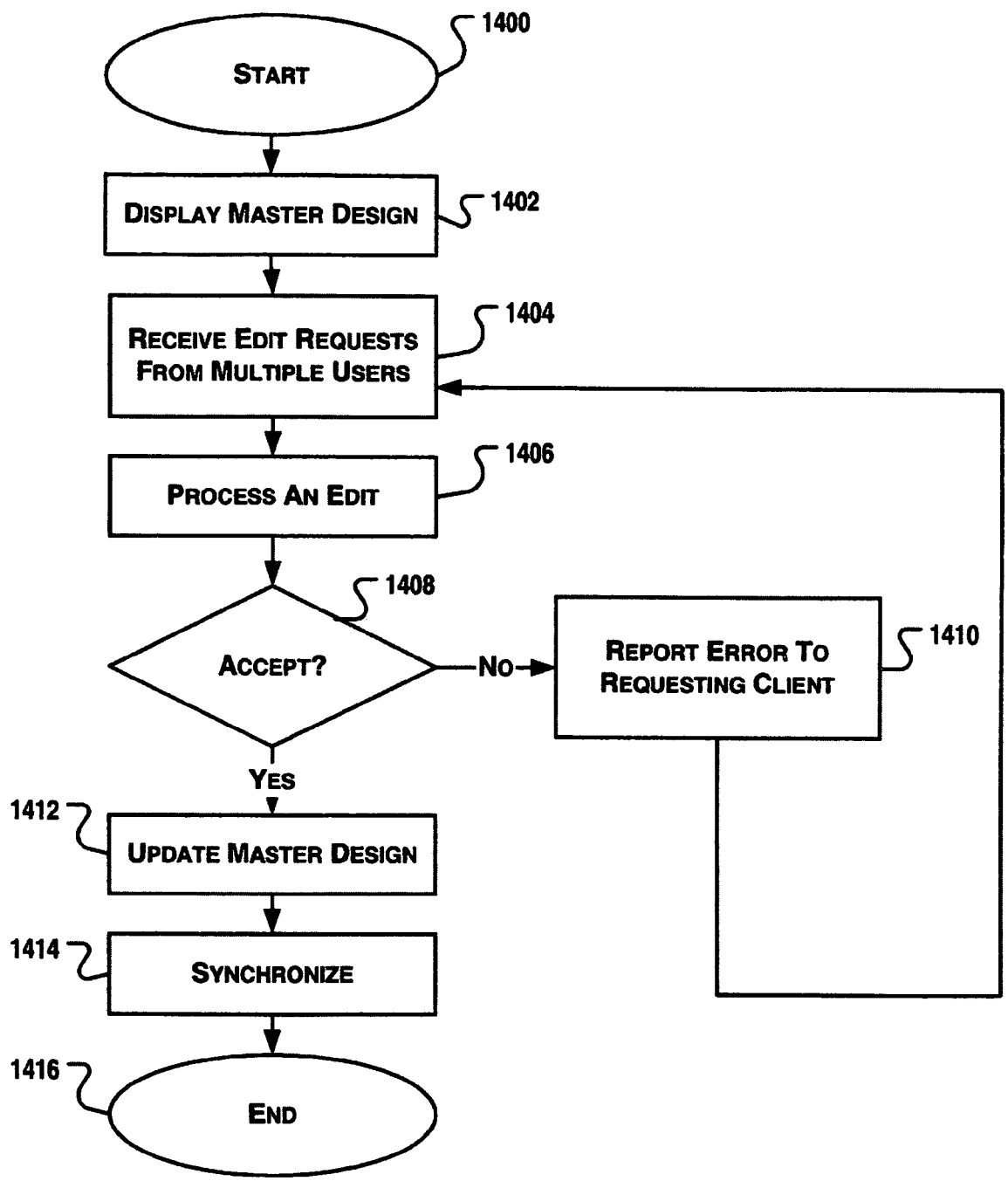
FIG. 14 is a flowchart illustrating a method in accordance with general embodiments of the invention.

FIG. 14 is a flowchart illustrating a method in accordance with general embodiments of the invention as discussed above. It begins at block 1400 and continues to block 1402 where a master design is displayed to a plurality of clients. In one embodiment, each client views the master design from the server database. In another embodiment, each client maintains a copy of the master design in the client's own memory space.

At block 1404, one or more edit requests are received from multiple users. At block 1406, a given edit request is processed. In one embodiment, an edit request is processed by subjecting the edit request to client conflict checking and resolution, prior to submitting the edit request to the server for server conflict checking and resolution, if needed. In another embodiment, the edit request is directly submitted to the server for server conflict checking and resolution.

At block 1408, it is determined if the edit request has been accepted. If the edit request passes conflict checking and resolution, then it is accepted. Otherwise, the edit request is rejected. If the edit request is accepted, then at block 1412, the master design is updated, and clients are synchronized with master design at block 1414. If the edit request is rejected, it is reported as an error to the appropriate client at block 1410. The method ends at block 1416.

Example Shared PCB Editing Environment

Figure 15:
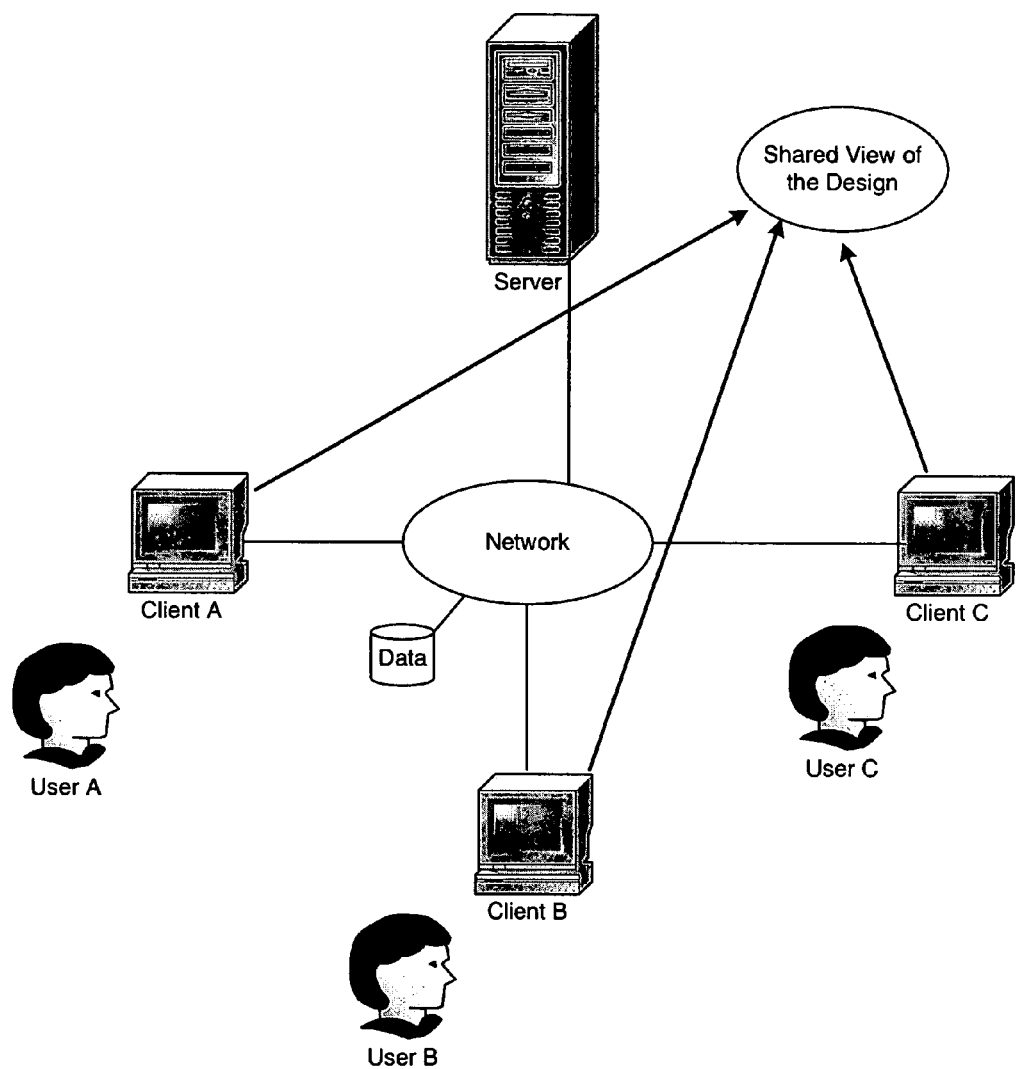
FIG. 15 is a conceptual diagram illustrating a shared simultaneous editing environment according to at least one embodiment of the invention.

FIG. 15 is a conceptual diagram illustrating a shared simultaneous editing environment according to at least one embodiment of the invention. A design session manager (or server) communicates in a networked environment with multiple design clients (clients A, B and C) operated by multiple users (users A, B and C). The server maintains a database containing the master PCB design. The database may be located at the server or elsewhere in the network (e.g., "data" in FIG. 15). Software executed by the server receives edit requests from each client, and checks each request to ensure it will not conflict with another edit request or otherwise cause a design rule violation. If an edit request does not conflict or otherwise violate a design rule, the server accepts the edit and synchronizes each client to include that edit. Each client has a processor and memory. Each client is able to view the entire design, as well as edits corresponding to server-accepted edit requests from other clients.

Each printed circuit board design may have an associated design team. Members of the team are given access permission to the design data. A team member can start a design session on the server from a single client. Additional clients can then join the session. After the design is initially loaded on the server, each client is initialized and synchronized when joining the session. In particular, the current state of the design is downloaded from the server into the client memory. Once a client has joined the design session, a client user may request edits to the design using standard editing tools available in an application executing on the client.

Processing by the server is based upon edit events. An edit event is a discrete action by a client that is captured at the client and sent to the server as an edit request. For example, moving a component from point A to point B could constitute an edit event. In some embodiments, such an event automatically begins with the selection of a component and ends with a mouse click, mouse button release, coordinate entry indicating a new component location, or other design action using an editing tool in a client application. The client sends the edit request to the server as a transaction describing what is to be deleted, added and/or otherwise modified in the master design. As previously described, the client may perform a local design rule check (DRC) before transmitting an edit request to the server.

Figure 16:
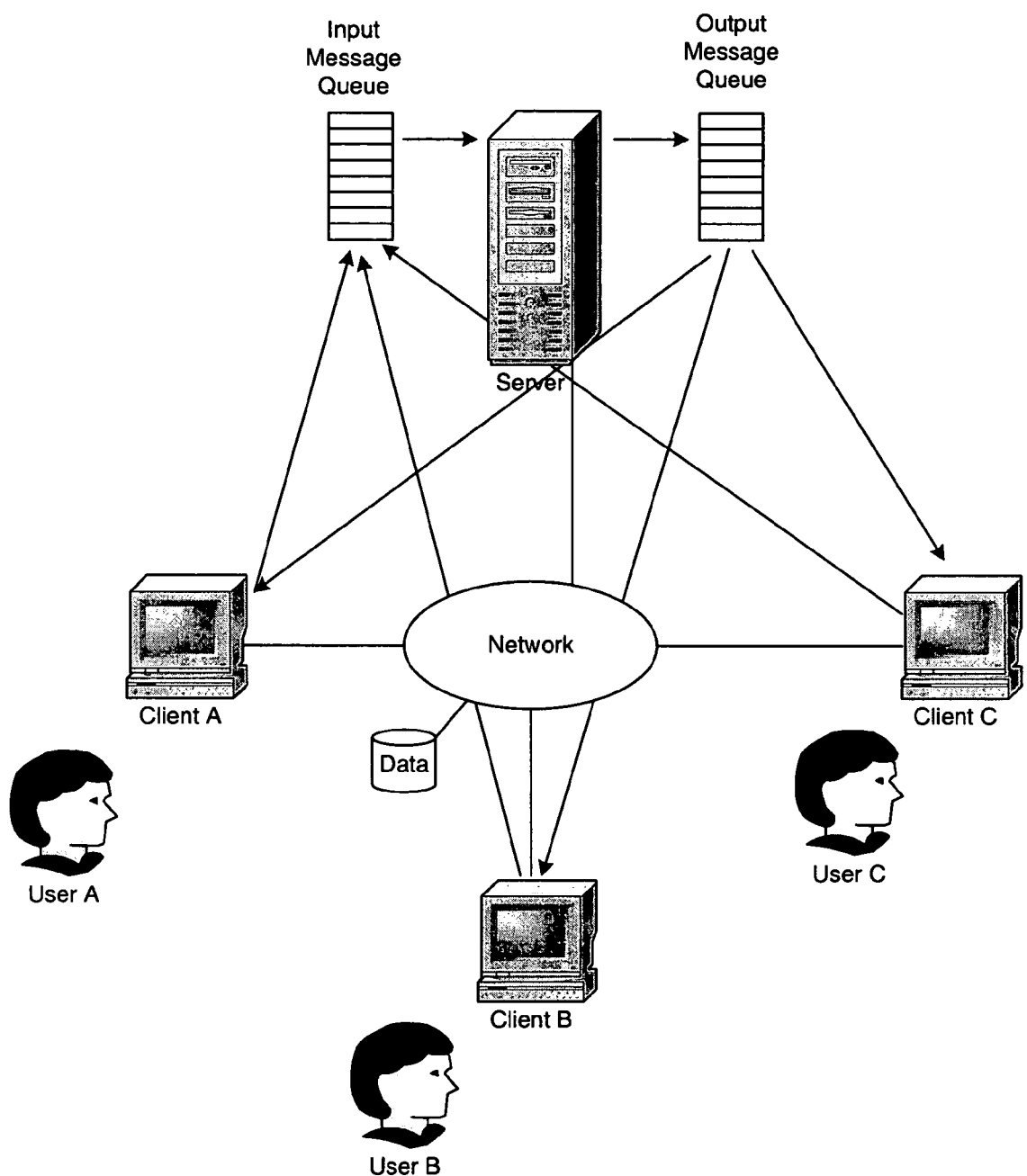
FIG. 16 is a conceptual diagram illustrating client-server messaging according to at least one embodiment of the invention.

Upon transmission of the edit request to the server, and as shown in FIG. 16, the request goes into an Input Message Queue. In some embodiments, each request in the queue has a FIFO (first-in-first-out) priority. In other embodiments, priority is assigned in another manner, e.g., as described above. The server takes each edit request from the Input Message Queue, integrates the requested edit into the design database, and performs a DRC upon the edit. Even if the client previously performed a DRC, the server also performs a DRC check because the design state in the server may have changed (because of another client's action) since the DRC performed by the client. If a violation is found (e.g., the edit conflicts with an edit previously submitted by the same or different client), the server may first attempt to correct the problem (e.g., slightly moving an object). If the problem is not correctable, the server rejects the edit request and returns the master design to the state occupied prior to integrating the requested edit. The server then notifies the client submitting the edit request of the rejection. If no violations are found, the edit request is accepted (i.e., the integrated edit is left in place) and a message is sent (through an Output Message Queue) to all the clients for synchronization of each client with the main database.

The client making an edit request does not treat the edit event as completed until the server broadcasts the synchronization message to all clients. This means that when, e.g., the original client clicks the mouse to complete an edit event, the edit is not confirmed graphically or otherwise until the confirmation notification and data update is sent to all clients to synchronize the clients with the server database. For example, the edit may be shown in a different color on the requesting user's display until confirmation notification is received.

In at least some embodiments, most computer processing occurs at clients. Objects are added, edited and deleted at the clients, and any automation associated with those edits is performed, such as push and shove (i.e., automatically moving objects or groups of objects), glossing (eliminating superfluous routes and other objects), etc. The server has a relatively light load compared to the clients and is unlikely to cause delays and/or other performance problems.

Exploring Alternative Design Changes

In at least some embodiments of the invention, a user defines a protected region in a part of the design that would otherwise be editable by other users. Within that protected region, the user can make numerous changes to corresponding parts of the PCB design data stored at the user's client without those changes being immediately forwarded to the server as edit requests. Indeed, the user may discard some or all of those changes without ever attempting to incorporate those changes into the master PCB design. In this manner, the user is able to explore possible alternate design changes before committing to a particular set of design choices. In certain embodiments, protected regions are defined using protection borders such as are described in connection with FIG. 7.

Figure 17:
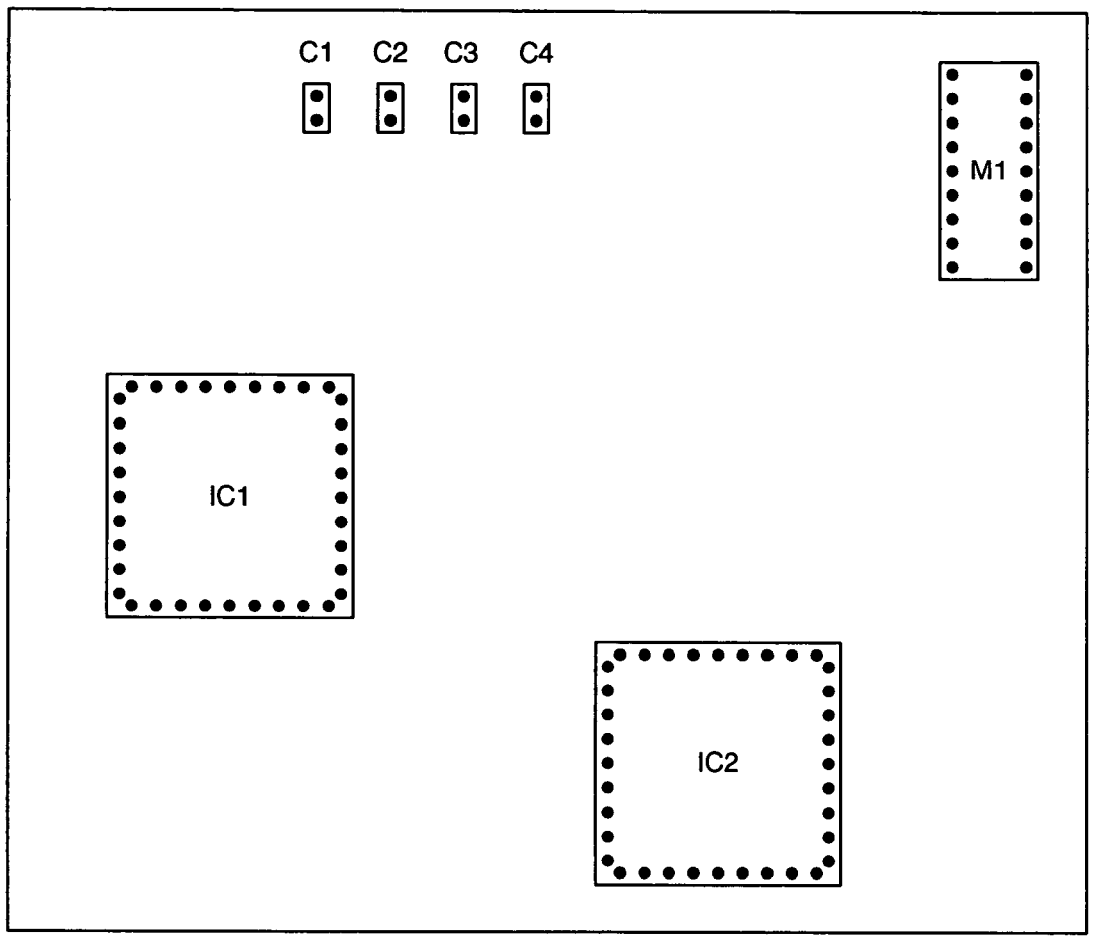
FIG. 17 is a block diagram of a portion of PCB design used to further illustrate several embodiments of the invention.

FIG. 17 is a block diagram of a portion of PCB design which will be used to further illustrate several embodiments of the invention. As shown in FIG. 17, locations for various electronic components have been mapped onto a PCB (or "placed"). For example, the locations of integrated circuits IC1 and IC2 are shown as large squares. A location for chip M1 is shown as a large rectangle. Capacitors C1 through C4 are shown as smaller rectangles. Each component in FIG. 17 has two or more pins (shown as large dots) to which one or more conductive traces is to be connected. For simplicity, subsequent figures will show traces added to the PCB design of FIG. 17 on a single side of the board. However, the invention is applicable to PCB designs for multi-layered boards. For example, a PCB may have traces formed on both sides of the board and/or on intermediate layers; traces on opposing sides (or different layers) are connected using a "via" (i.e., a hole drilled into the board to connect the traces, which hole is then filled or partially filled with conductive material). Similarly, the components shown in the PCB design of FIG. 17 are merely examples, and the invention is not limited by the number, type or arrangement of components. As persons skilled in the art can appreciate, the PCB design of FIG. 17 is a simplified example. In practice, a complete circuit is often much more complex, and may have hundreds of components and hundreds or thousands of pins.

Figure 18:
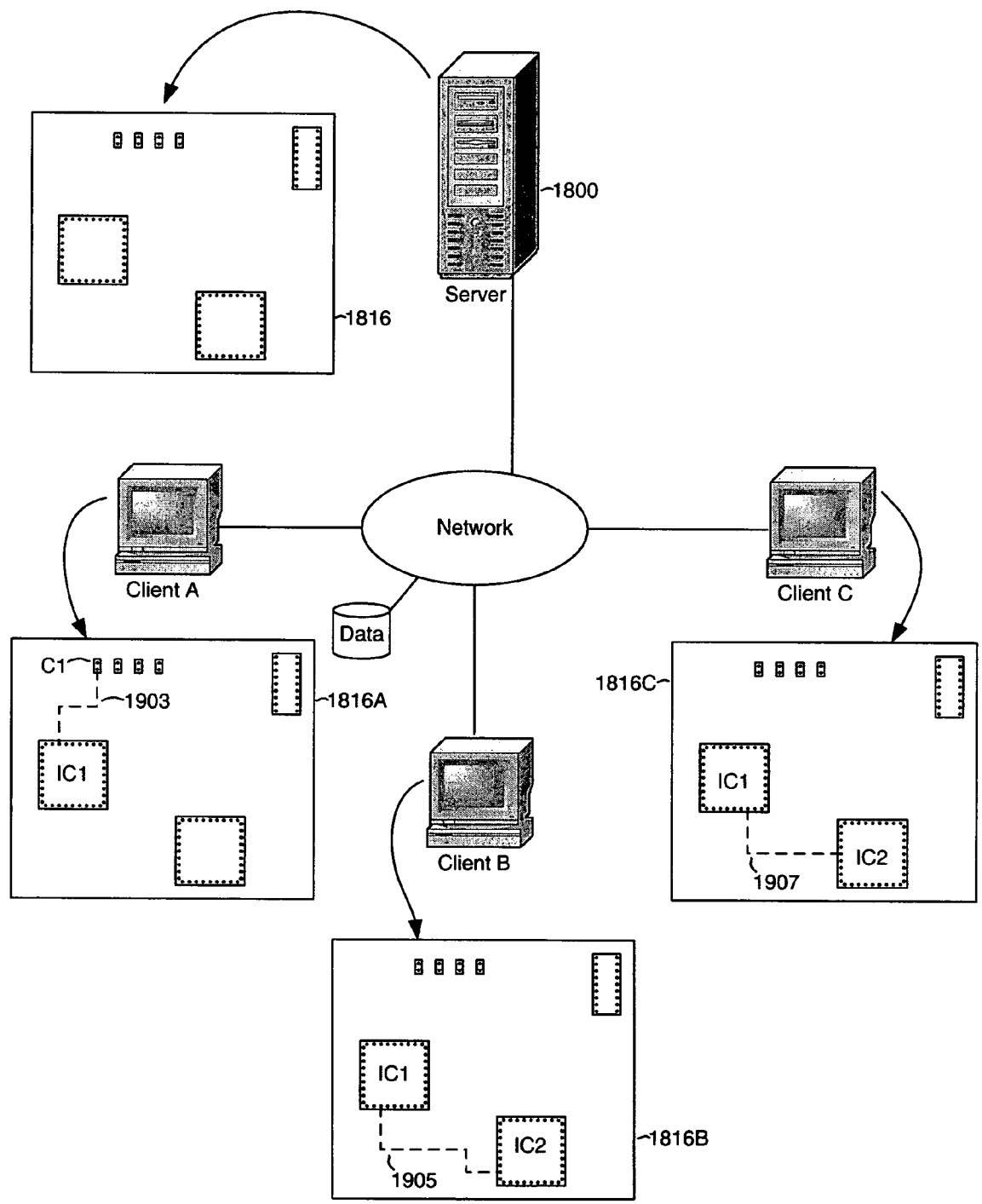
FIG. 18 is a block diagram showing the PCB design from FIG. 17 maintained by a server as a master PCB design 1816 and by clients A, B and C as local copies.

As shown in FIG. 18, the PCB design from FIG. 17 is maintained by a server 1800 as a master PCB design 1816. Clients A, B and C store local copies (1816A, 1816B and 1816C) of the master design 1816. Although only three clients are shown in the following example, the invention is not limited by the number of clients. As previously described in connection with other embodiments, each of clients A, B and C may simultaneously submit edit requests to server 1800 so as to make changes to master design 1816. If an edit request is accepted, server 1800 sends synchronization data to clients A, B and C to update their local copies 1816A, 1816B and 1816C. If an edit request is rejected, server 1800 notifies the client submitting the rejected edit request. In FIG. 18, client A has submitted an edit request seeking to add connection 1903 between IC1 and C1. Client B has submitted an edit request seeking to add connection 1905 between IC1 and IC2. Client C has submitted an edit request seeking to add connection 1907 between IC1 and IC2.

Figure 19:
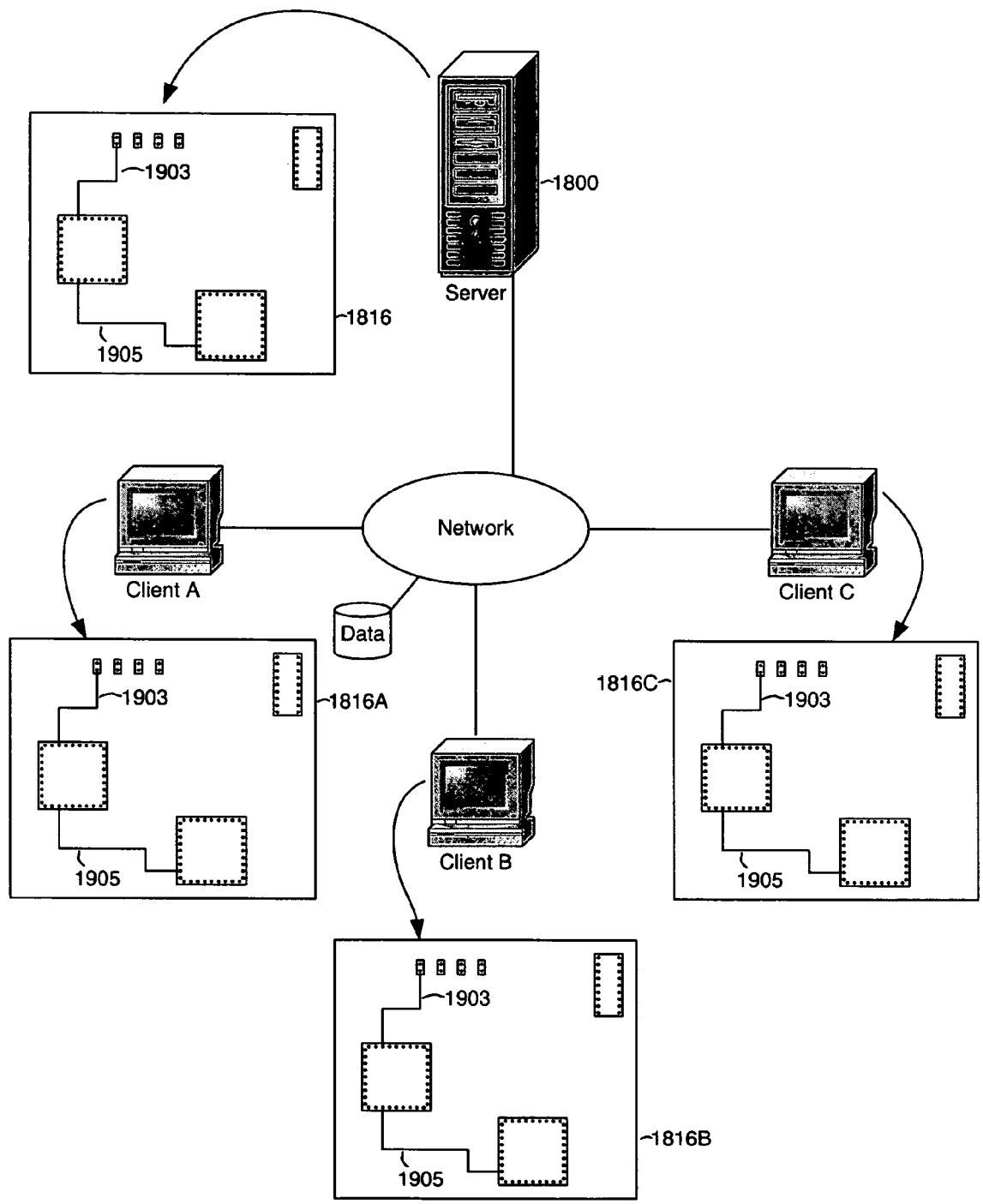
FIG. 19 shows the server and clients of FIG. 18 subsequent to acceptance and rejection of edits requests submitted by the clients.

FIG. 19 shows server 1800 and clients A, B and C at a time subsequent to the time of FIG. 18. Server 1800 has accepted connections 1903 and 1905 and sent appropriate synchronization data to the clients. The edit request from client C was taken off the input queue (not shown) after the edit request from client B (adding connection 1905) was accepted. Because connection 1907 was too close to connection 1905, a design rule violation occurred when client C made its edit request. Therefore, server 1800 rejected the edit request to add connection 1907, and forwarded that rejection (not shown) to client C.

Figure 20:
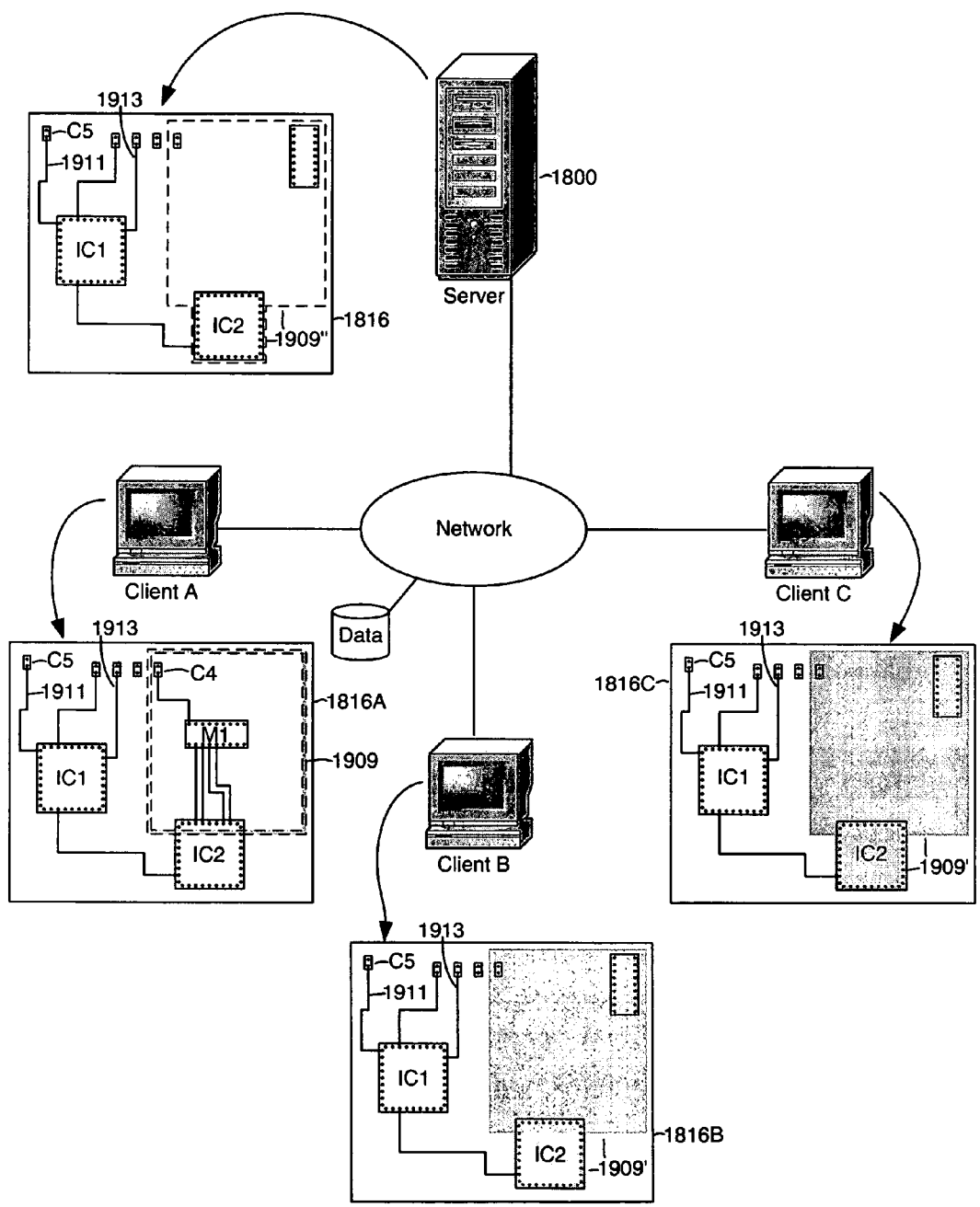
FIG. 20 shows the server and clients of FIG. 19 after placement of a protection boundary around a portion of the PCB design, as well as edits made within the protection boundary and not transmitted as edit requests.

FIG. 20 shows server 1800 and clients A, B and C at a time subsequent to the time of FIG. 19. A user at client A has defined a protected region by drawing a protection border 1909 around a portion of PCB design copy 1816A. In at least some embodiments, design components straddling border 1909 (e.g., IC2) are also included in the protected region. In other words, clients B and C cannot add connections to IC2 pins inside of border 1909, and cannot move IC2. In some embodiments, clients B and C are also prevented from adding connections to pins of IC2 outside of protection border 1909. Server 1800 notes the protection border (dashed line 1909"), and sends messages to clients B and C indicating the protected region within border 1909" of the PCB master design and that edit requests for portions of the design within that protected region will be rejected. In at least some embodiments, this message causes clients B and C to display the protected region (e.g., as shaded regions 1909').

While border 1909 is in place, the user at client A uses the protected region defined by the border (and any extensions to cover straddling design elements) to explore alternative design changes. As client A makes changes within the protected region, corresponding edit requests are not automatically sent to server 1800. Instead, those changes are stored as local edits on local copy 1816A. If the user at client A is satisfied with the changes within the protected region, and as described below, the user may send those changes to server 1800. If the user at client A is not satisfied with those changes, the user may discard those changes, make other changes, and/or take other actions to explore various design alternatives. In the example of FIG. 20, the client A user has moved component M1, added several connections between M1 and IC2, and added a connection between M1 and C4. Because the portion of master design 1816 corresponding to the protected region is locked, users at clients B and C are prevented from making potentially conflicting edits within the same region.

While border 1909 is in place, editing within other portions of the PCB design may proceed. As seen in FIG. 20, and in response to edit requests from clients A, B and/or C, capacitor C5, connection 1911 and connection 1913 have been added to master design 1816. Server 1800 has also provided appropriate synchronization data reflecting the changes to all of the clients. Accordingly, the user at client A is able to keep track of edits made by other users as he or she explores various alternative design changes within the protected region inside border 1909.

Figure 21:
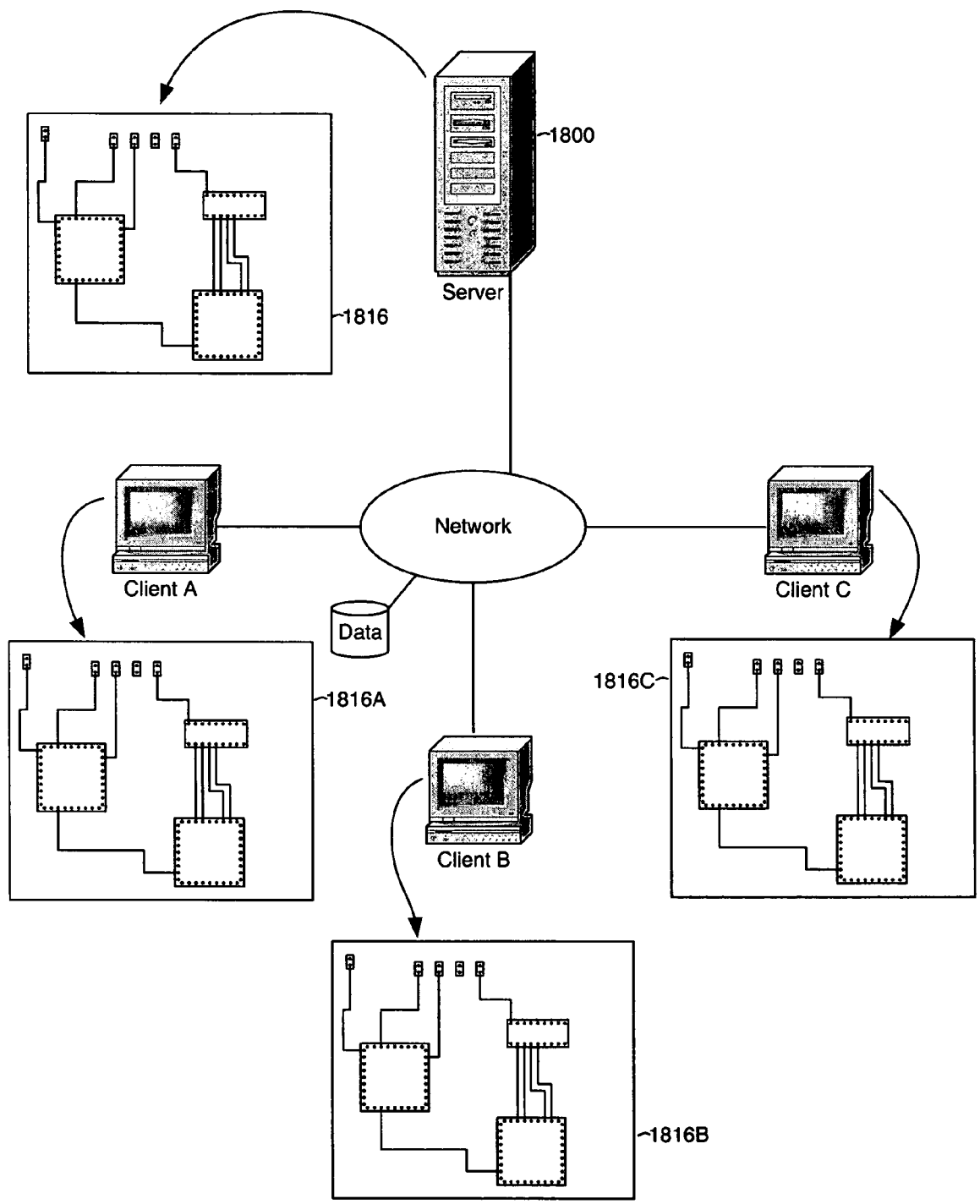
FIG. 21 shows the server and clients of FIG. 20 at a subsequent time.

FIG. 21 shows server 1800 and clients A, B and C at a time subsequent to the time of FIG. 20. The client A user decided that the movement of M1, the M1/IC2 connections and the M1/C4 connection were satisfactory, and caused forwarding of one or more edit requests to server 1800 requesting that those changes be made to master design 1816. After receiving the edit request(s) for the movement of M1, the M1/IC2 connections and the M1/C4 connection, server 1800 added those changes to master design 1816, performed DRC(s), and determined that no design rules were violated. Server 1800 then forwarded appropriate synchronization data to the clients. In some embodiments, client A performs DRC for changes within a protected region prior to transmitting one or more edit requests for those changes.

Figure 22:
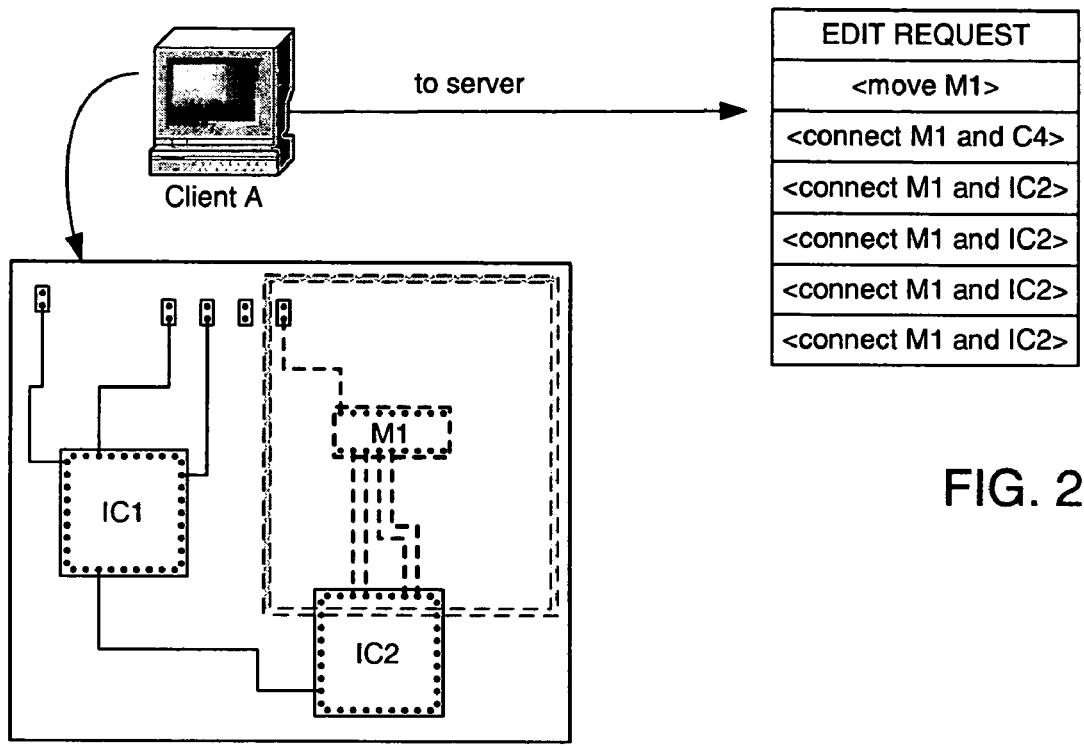
FIGS. 22-27 show various manners in which locally stored edits may be transmitted as edit requests.

There are various manners in which client A can request that edits within a protected region be incorporated into master design 1816. In some embodiments, and as shown in FIG. 22, client A creates a single edit request containing all of the changes. Client A creates (and/or sends) this edit request in response to a user instruction distinct from the user instructions to makes the edits (to local copy 1816A) within the protected region. Stated differently, the mouse clicks and/or other user actions which caused movement of M1 and addition of the M1/C4 and M1/IC2 connections do not cause client A to send edit requests seeking inclusion of those changes to master design 1816. Instead, the user invokes one or more separate commands to cause the edit request to be sent. As one example, the user could initiate the edit request through a dialog box (not shown) having a button or other user interface which initiates an edit request corresponding to all changes in the protected region.

Figure 23:
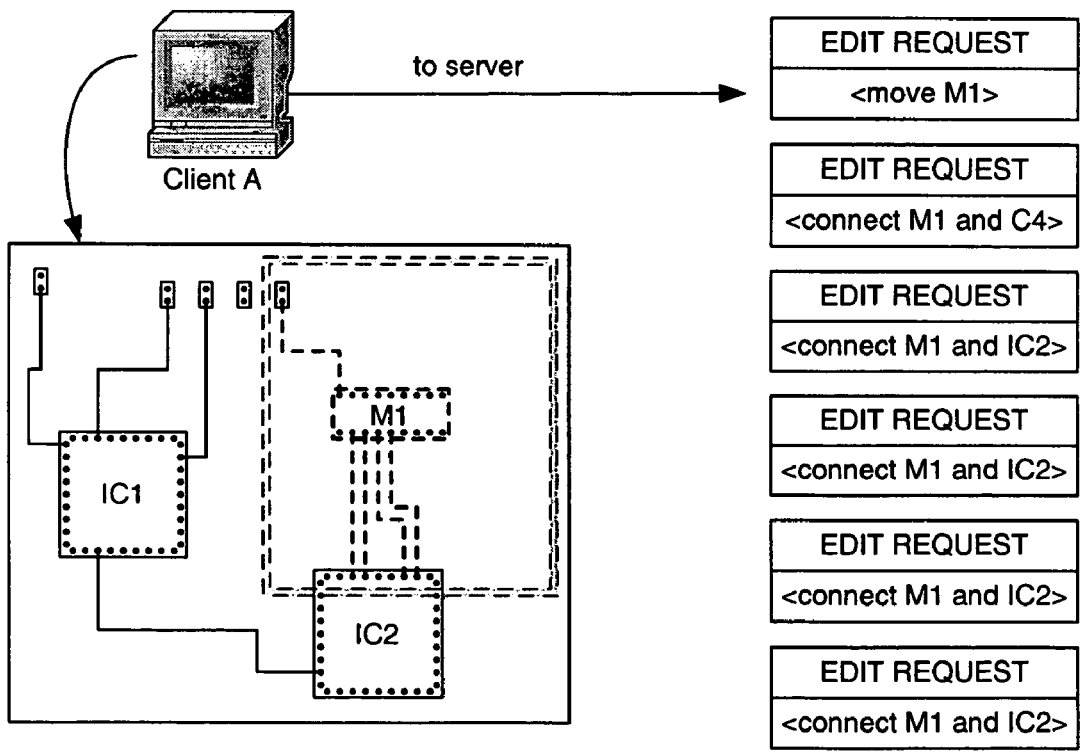
Figure 24:
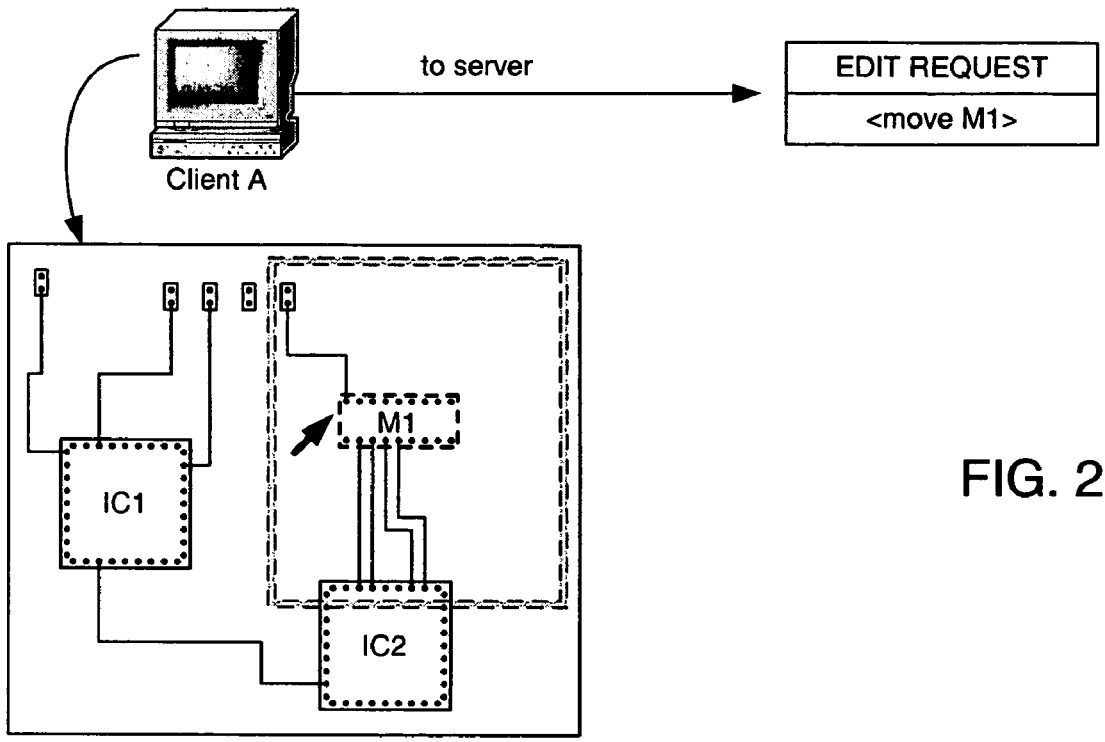
Figure 25:
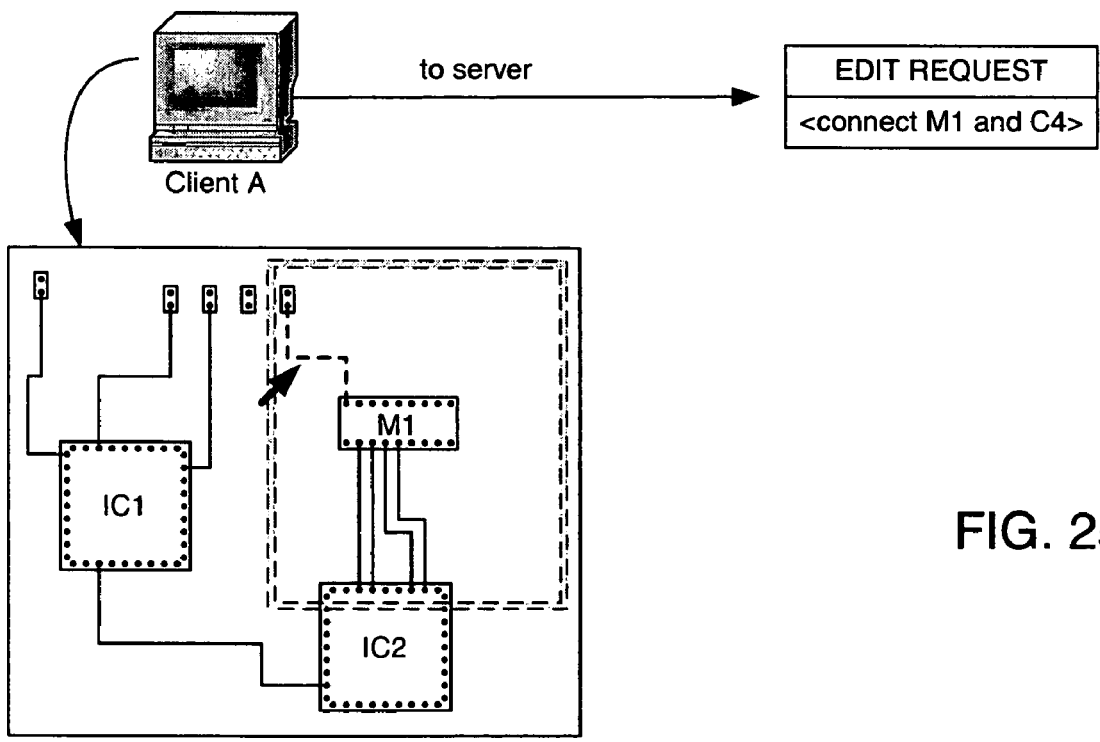
Figure 26:
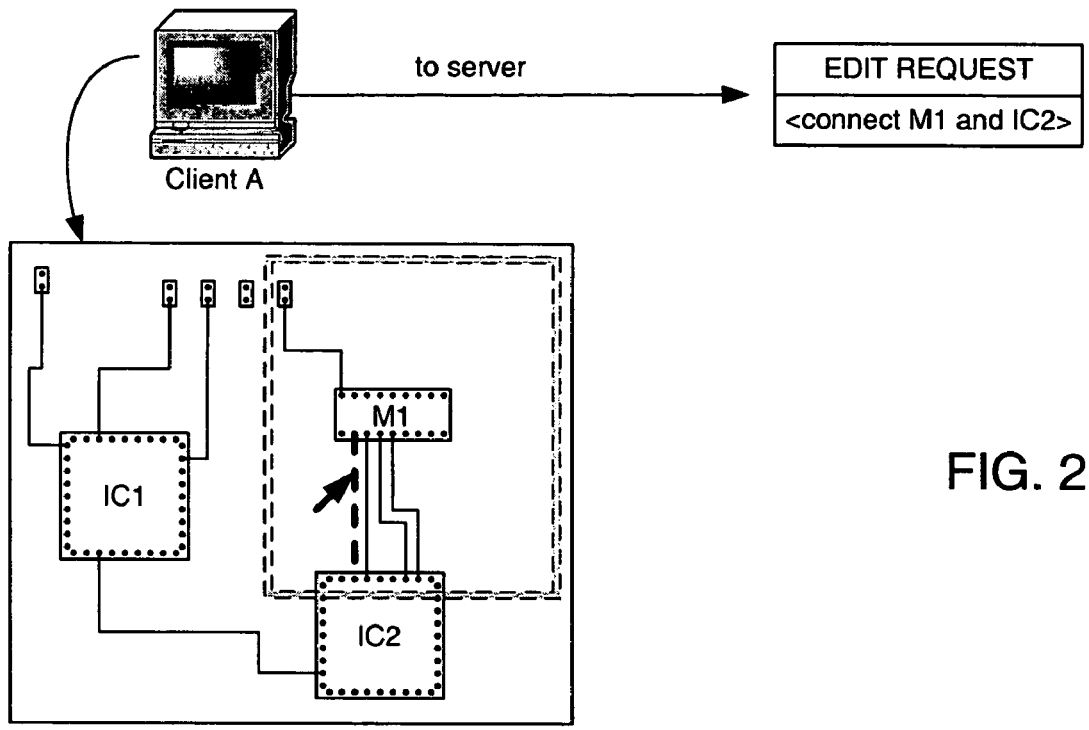
Figure 27:
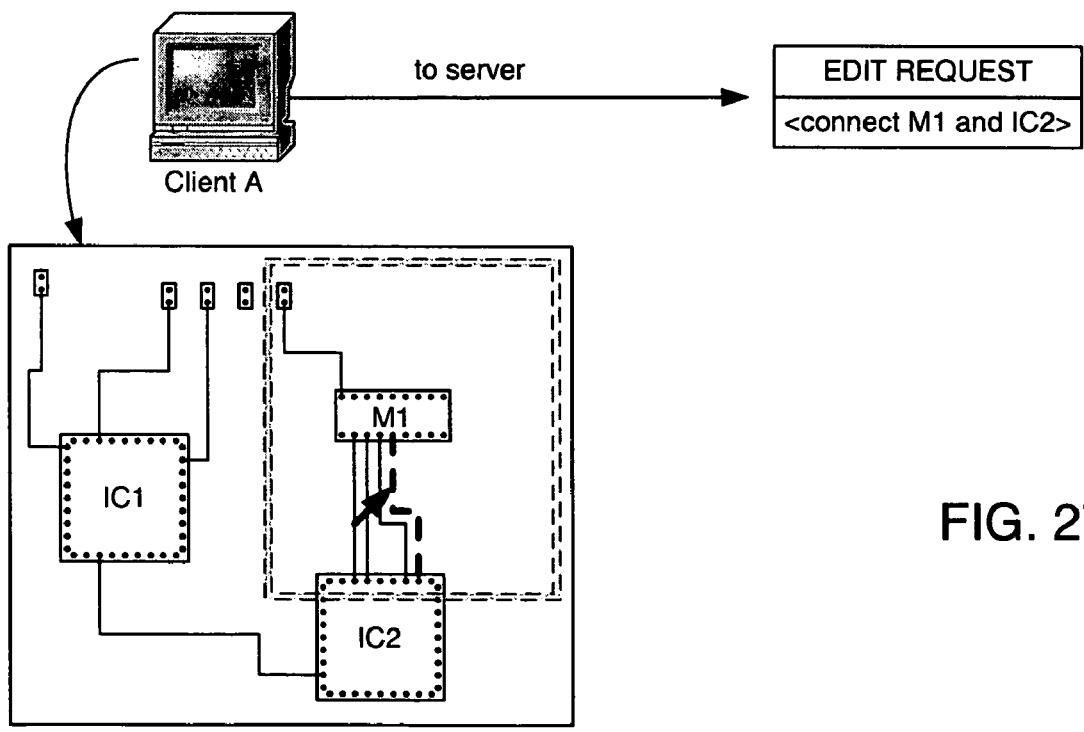

In other embodiments, and as shown in FIG. 23, client A automatically generates a series of edit requests corresponding to the desired changes. These requests are similarly generated in response to a user instruction distinct from the instructions by which the local edits were initially made. In still other embodiments, and as shown in FIGS. 24-27, a user at client A can step through the locally-stored changes in the protected region and submit corresponding edit requests one at a time. As one example, after moving M1 and adding the M1/C4 and M1/IC2 connections, the user may highlight movement of M1 (FIG. 24) and then invoke a dialog box or other user interface (not shown) by which a corresponding edit request is sent. FIGS. 25-27 show highlighting of individual connections within the protected region. As still another example, the user-made changes in the protected region of border 1909 may be stored automatically as the changes are being made, and the system (either the client or the server) could prompt the user (e.g., when the user cancels the protected zone) for input asking whether the changes should be submitted for incorporation into master design 1816.

Figure 28:
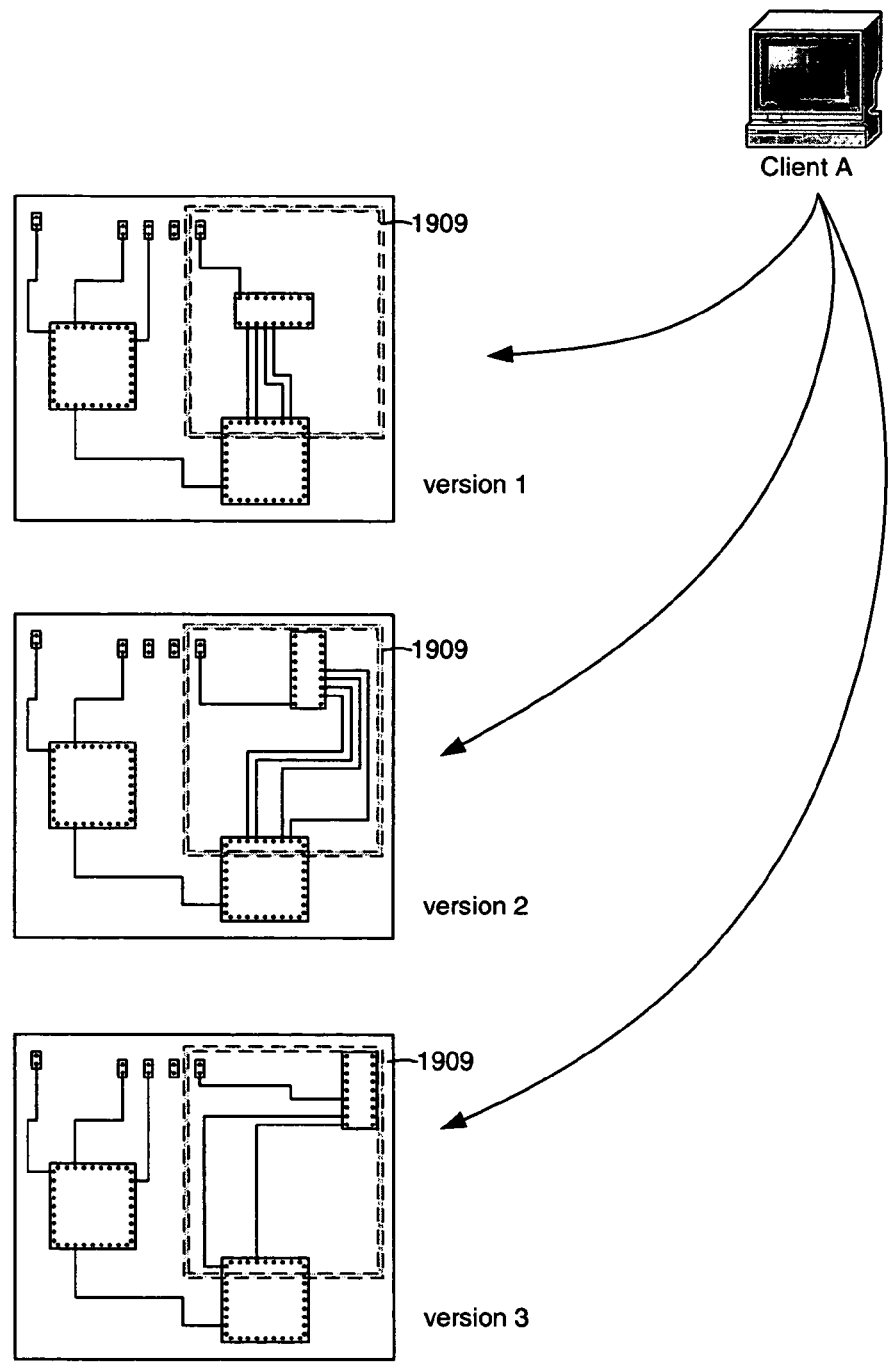
FIG. 28 shows storage of multiple versions of edits within a protection boundary.

In at least some embodiments, and as shown in FIG. 28, client A is configured to store several versions of local copy 1816A. Each version may be used to evaluate different design changes within the boundary 1909. When a synchronization message is received from server 1800, each copy (e.g., each of versions 1, 2 and 3) is updated to reflect changes to portions of master design 1816 outside of border 1909. When the client A user determines that one of the saved versions is satisfactory, one or more edit requests for changes in that version are forwarded to server 1800 as described above. In at least some embodiments, client A automatically assigns version numbers to the saved versions and manages those versions for the user. For example, when seeking to submit edit requests based on saved changes, client A could present the user with a dialog box or other interface asking the user to select version 1, 2 or 3. In some embodiments, client A is further configured to alert the user if changes to portions of master design 1816 occurred after the user created a particular version being selected. For example, after a user creates version 2 (FIG. 28), one or more changes to portions of design 1800 outside of border 1909 may be made by the client A user or by other users. By the time the user selects version 2 for submission of corresponding edit requests to server 1800, the user may have forgotten about (or be otherwise unaware of) those changes; the user alert would then remind (or inform) the user of those changes.

CONCLUSION

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. For example, a master design 116 may be partitioned into areas, and the areas may then be designated as shared or exclusive. The use of protected regions described in connection with FIGS. 7 and 17-28 could then be implemented in connection with shared areas (including areas shared by a designated user group) of a master design partitioned into shared and exclusive areas. Although FIGS. 20 and 23-28 show definition of a protected region using a protection boundary, this is but one embodiment of the invention. In other embodiments, protection regions may defined in other manners (e.g., specifying coordinates for the region(s), specifying layers for the region(s), specifying object types to be protected, etc.). Multiple protected regions can be instantiated by one or more clients. In some embodiments, the users at one or more clients such as client B or client C (FIGS. 19-21) may be able to view changes made by client A to the protected region inside border 1909, even though such changes have not yet been incorporated into master design 1816. In some of such embodiments, client A notifies server 1800 of the local edits being made to the protected region, but those edits are not made to master design 1816 until specifically requested by client A.

Accordingly, the invention is not to be limited by the preceding examples, and is instead described by the claims appended hereto. In the claims, various portions of the claims are prefaced with letter references for convenience. However, use of such letter references does not imply a temporal relationship not otherwise required by the language of the claims.

The invention claimed is:

1. A computer-implemented method for editing a printed circuit board design maintained in a common database storing printed circuit board design data incorporating edits from multiple clients, comprising:
  (a) receiving design data from the common database at each of first and second clients, wherein
    the design data is graphically displayable at the first and second clients as a pattern of electronic components and connections between those components for at least a portion of the printed circuit board design, and
    the pattern of electronic components and connections between those components corresponds to a shared area of the printed circuit board design throughout which the first and second clients have simultaneous access to edit design objects and to cause modification of the common database to reflect said design object edits;
  (b) subsequent to step (a), receiving an instruction at the first client to protect a portion of the shared area from editing by the second client, wherein the instruction comprises a line drawn around the protected portion at the first client that defines a boundary of the protected portion;
  (c) subsequent to step (b), transmitting an edit request from the second client regarding the protected portion; and
  (d) receiving data at the second client reflecting rejection of the edit request, said rejection being based on the presence of the protected portion.

2. The method of claim 1, further comprising:
  (e) receiving at the second client data indicating the presence of the protected portion; and
  (f) displaying the protected portion at the second client.

3. The method of claim 1, further comprising:
  (e) detecting user actions at each of the clients during an editing session in which the protected portion remains in place, the user actions pertaining to portions of the shared area not within the protected portion, wherein
    the first and second clients continue to have simultaneous access to edit design objects in portions of the shared area outside the protected portion and to cause modification of the common database to reflect said edits;
  (f) transmitting during the editing session, edit requests corresponding to the actions detected in step (e);
  (g) receiving synchronization data messages at the clients during the editing session, the synchronization data permitting update of displays at the first and second clients to reflect application to the shared area of at least one of the transmitted edit requests which did not violate a design rule; and
  (h) receiving rejection notification data at one of the clients during the editing session, wherein
    the client receiving the rejection notification data transmitted, in step (f), an edit request violating a design rule, and
    the rejection notification data indicates non-application to the shared area of the edit request violating the design rule.

4. The method of claim 1, further comprising:
  (e) subsequent to step (b), detecting multiple user actions at the first client editing the protected portion of the shared area, wherein
    the first and second clients continue to have simultaneous access to edit design objects in portions of the shared area outside the protected portion and to cause modification of the common database to reflect said edits; and
  (f) incorporating, into a copy of the design data stored at the first client, local edits corresponding to the user actions detected in step (e), wherein
    edit requests corresponding to the local edits are not transmitted from the first client prior to receipt of a specific instruction, and
    the specific instruction is independent of the actions detected in step (e).

5. The method of claim 4, further comprising:
  (g) receiving at the first client an instruction to transmit an edit request corresponding to one or more of the local edits; and
  (h) transmitting an edit request in response to the instruction received in step (g).

6. The method of claim 5, wherein steps (g) and (h) further comprise:
  receiving an instruction to transmit a first edit request corresponding to one of the local edits,
  transmitting the first edit request,
  receiving an instruction to transmit a second edit request corresponding to another of the local edits, and
  transmitting the second edit request.

7. The method of claim 5, wherein steps (g) and (h) further comprise:

receiving an instruction to transmit a single edit request corresponding to plural local edits, transmitting the single edit request.

8. The method of claim 5, wherein steps (g) and (h) further comprise:

receiving a single instruction to transmit plural edit requests corresponding to plural local edits, transmitting, in response to the single instruction, plural edit requests corresponding to the plural local edits.

9. The method of claim 4, further comprising:

(g) saving the design data copy with the local edits incorporated in step (f);

(h) repeating steps (e) and (f) for a second copy of the design data; and (i) saving, without discarding the copy saved in step (g), the second design data copy with the local edits incorporated in step (h).

10. The method of claim 9, further comprising:

(j) receiving at the first client a selection of the copy saved in step (g) or the copy saved in step (i); and (k) transmitting edit requests corresponding to the copy selected in step (j).

11. The method of claim 4, wherein step (b) comprises receiving an instruction to draw the line such that a portion of a straddling design object is inside a region bounded by the line and a portion of the staddling design object is outside the region bounded by the line, and further comprising:

(g) automatically expanding the protected portion to include the entire straddling design object.

12. A computer-implemented method for editing a printed circuit board design maintained in a common database storing printed circuit board design data incorporating edits from multiple clients, comprising:

(a) receiving design data from the common database at a first client, wherein the design data is graphically displayable at the first client and at one or more other clients as a pattern of electronic components and connections between those components for at least a portion of the printed circuit board design, and the pattern of electronic components and connections between those components corresponds to a shared area of the printed circuit board design throughout which the first client and the one or more other clients have simultaneous access to edit design objects and to cause modification of the common database to reflect said object edits;

(b) subsequent to step (a), receiving an instruction at the first client to protect a portion of the shared area that is defined by a line drawn around the protected portion to prevent editing within the protected portion by the one or more other clients; and (c) transmitting, in response to the instruction received in step (b) and for broadcast to the one or more other clients, a protection border indicating reservation of the protected portion of the shared area for the first client.

13. The method of claim 12, further comprising:

(d) receiving, while the protected portion of the shared area is reserved for the first client, synchronization data messages permitting update of a first client display to reflect application to a non-protected portion of the shared area of at least one edit request from one of the one or more other clients, said applied edit request not violating a design rule.

14. The method of claim 12, further comprising:

(d) detecting, subsequent to step (b), multiple user actions made through the first client including edits to the protected portion of the shared area; and (e) incorporating, into a local copy of the design data stored at the first client, local edits corresponding to the user actions detected in step (d), wherein edit requests seeking incorporation of the local edits into the common database are not transmitted from the first client prior to receipt of a specific instruction, and the specific instruction is independent of the actions detected in step (d).

15. The method of claim 14, further comprising:

(f) receiving at the first client one or more instructions to transmit one or more edit requests corresponding to one or more of the local edits; and (g) transmitting one or more edit requests in response to the one or more instructions received in step (f).

16. The method of claim 14, further comprising:

(f) saving the design data copy with the local edits incorporated in step (e);

(g) repeating steps (d) and (e) for a second copy of the design data; and (h) saving, without discarding the copy saved in step (f), the second design data copy with the local edits incorporated in step (g).

17. The method of claim 16, further comprising:

(i) receiving at the first client a selection of the copy saved in step (f) or the copy saved in step (h); and (j) transmitting one or more edit requests corresponding to the copy selected in step (i).

18. The method of claim 12, wherein step (b) comprises receiving an instruction to draw the line such that a portion of a straddling design object is inside a region bounded by the line and a portion of the straddling design object is outside the region bounded by the line, and further comprising:

(d) automatically expanding the protected portion to include the entire straddling design object.

19. A computer-implemented method for editing design data for a printed circuit board maintained in a common database storing printed circuit board design data incorporating edits from multiple clients, comprising: clients, comprising:

(a) transmitting the design data from the common database to each of first and second clients, wherein the design data is graphically displayable at the first and second clients as a pattern of electronic components and connections between those components for at least a portion of the printed circuit board design, and the pattern of electronic components and connections between those components corresponds to a shared area of the printed circuit board design throughout which the first and second clients have simultaneous access to edit design objects and to cause modification of the common database to reflect said design object edits;

(b) subsequent to step (a), receiving from the first client a designation of a protected portion of the shared area, said protected portion defined by a line drawn at the first client;

(c) transmitting the line to the second client for display thereon; and (d) preventing the second client from editing parts of the shared area within the protected portion.

20. The method of claim 19, further comprising:

(e) receiving a request from the second client to edit a part of the shared area within the protected portion; and (f) transmitting notification to the second client of rejection of the edit request received in step (e).

21. The method of claim 19, further comprising:
(e) receiving a request from the second client to edit a part of the shared area not within the protected portion; and
(f) transmitting synchronization data to the first client, said synchronization data permitting update of a first client display to reflect application to the shared area of the edit request received in step (e).

22. The method of claim 19, further comprising:
(e) receiving from the first client one or more requests to edit parts of the shared area within the protected portion; and
(f) applying to the protected portion the one or more edit requests received in step (e).

23. A tangible machine-readable storage device having stored thereon data representing sequences of instructions which, when executed by a processor, cause the processor to perform steps of method for editing a printed circuit board design maintained at a common database storing printed circuit board design data incorporating edits from multiple clients, the steps comprising:
(a) receiving design data from the common database at each of first and second clients, wherein
the design data is graphically displayable at the first and second clients as a pattern of electronic components and connections between those components for at least a portion of the printed circuit board design, and
the pattern of electronic components and connections between those components corresponds to a shared area of the printed circuit board design throughout which the first and second clients have simultaneous access to edit design objects and to cause modification of the common database to reflect said design object edits;
(b) subsequent to step (a), receiving an instruction at the first client to protect a portion of the shared area from editing by the second client, wherein the instruction comprises a line drawn around the protected portion at the first client that defines a boundary of the protected portion;
(c) subsequent to (b), transmitting an edit request from the second client regarding the protected portion; and
(d) receiving data at the second client reflecting rejection of the edit request, said rejection being based on the presence of the protected portion.

24. The tangible machine-readable storage device of claim 23, comprising further instructions for performing steps comprising:
(e) receiving at the second client data indicating the presence of the protected portion; and
(f) displaying the protected portion at the second client.

25. The tangible machine readable-storage device of claim 23, comprising further instructions for performing steps comprising:
(e) detecting user actions at each of the clients during an editing session in which the protected portion remains in place, the user actions pertaining to portions of the shared area not within the protected portion, wherein
the first and second clients continue to have simultaneous access to edit design objects in portions of the shared area outside the protected portion and to cause modifications of the common database to reflect said edits;
(f) transmitting, during the editing session, edit requests corresponding to the actions detected in step (e);
(g) receiving synchronization data messages at the clients during the editing session, the synchronization data permitting update of displays at the first and second clients to reflect application to the shared area of at least one of the transmitted edit requests which did not violate a design rule; and
(h) receiving rejection notification data at one of the clients during the editing session, wherein
the client receiving the rejection notification data transmitted, in step (f), an edit request violating a design rule, and
the rejection notification data indicates non-application to the shared area of the edit request violating the design rule.

26. The tangible machine-readable storage device of claim 23, comprising further instructions for performing steps comprising:
(e) subsequent to step (b), detecting multiple user actions at the first client editing the protected portion of the shared area, wherein
the first and second clients continue to have simultaneous access to edit design objects in portions of the shared area outside the protected portion and to cause modification of the common database to reflect said edits; and
(f) incorporating into a copy of the design data stored at the first client local edits corresponding to the user actions detected in step (e), wherein
edit requests corresponding to the local edits are not transmitted from the first client prior to receipt of a specific instruction, and
the specific instruction is independent of the actions detected in step (e).

27. The tangible machine-readable storage device of claim 26, comprising further instructions for performing steps comprising:
(g) saving the design data copy with the local edits incorporated in step (f);
(h) repeating steps (e) and (f) for a second copy of the design data; and
(i) saving, without discarding the copy saved in step (g), the second design data copy with the local edits incorporated in step (h).

28. The tangible machine-readable storage device of claim 26, wherein step (b) comprises receiving an instruction to draw the line such that a portion of a straddling design object is inside a region bounded by the line and a portion of the straddling design object is outside the region bounded by the line, and comprising further instructions for performing steps comprising:
(g) automatically expanding the protected portion to include the entire straddling design object.

29. The tangible machine-readable storage device of claim 27, comprising further instructions for performing steps comprising:
(j) receiving at the first client a selection of the copy saved in step (g) or the copy saved in step (i); and
(k) transmitting edit requests corresponding to the copy selected in step (j).

30. The tangible machine-readable storage device of claim 26, comprising further instructions for performing steps comprising:
(g) receiving at the first client an instruction to transmit an edit request corresponding to one or more of the local edits; and
(h) transmitting an edit request in response to the instruction received in step (g).

31. The tangible machine-readable storage device of claim 30, wherein steps (g) and (h) further comprise:

receiving an instruction to transmit a first edit request corresponding to one of the local edits, transmitting the first edit request, receiving an instruction to transmit a second edit request corresponding to another of the local edits, and transmitting the second edit request.

32. The tangible machine-readable storage device of claim 30, wherein steps (g) and (h) further comprise:

receiving an instruction to transmit a single edit request corresponding to plural local edits, transmitting the single edit request.

33. The tangible machine-readable storage device of claim 30, wherein steps (g) and (h) further comprise:

receiving a single instruction to transmit plural edit requests corresponding to plural local edits, transmitting, in response to the single instruction, plural edit requests corresponding to the plural local edits.

34. A tangible machine-readable storage device having stored thereon data representing sequences of instructions which, when executed by a processor, cause the processor to perform steps of method for editing a printed circuit board design maintained in a common database storing printed circuit board design data incorporating edits from multiple clients, the steps comprising:

(a) receiving design data from the common database base at a first client, wherein the design data is graphically displayable at the first client and at one or more other clients as a pattern of electronic components and connections between those components for at least a portion of the printed circuit board design, and the pattern of electronic components and connections between those components corresponds to a shared area of printed circuit board design throughout which the first client and the one or more other clients have simultaneous access to edit design objects and to cause modification of the common database to reflect said design objects edits;

(b) subsequent to step (a), receiving an instruction at the first client to protect a portion of the shared area that is defined by a line drawn around the protected portion to prevent editing within the protected portion by the one or more other clients; and (c) transmitting, in response to the instruction received in step (b) and for broadcast to the one or more other clients, a protection border indicating reservation of the protected portion of the shared area for the first client.

35. The tangible machine-readable storage device of claim 34, comprising further instructions for performing steps comprising:

(d) receiving, while the protected portion of the shared area is reserved for the first client, synchronization data messages permitting update of a first client display to reflect application to a non-protected portion of the shared area of at least one edit request from one of the one or more other clients, said applied edit request not violating a design rule.

36. The tangible machine-readable storage device of claim 34, comprising further instructions for performing steps comprising:

(d) detecting, subsequent to step (b), multiple user actions made through the first client including edits to the protected portion of the shared area; and (e) incorporating, into a local copy of the design data stored at the first client, local edits corresponding to the user actions detected in step (d), wherein edit requests seeking incorporation of the local edits into the common database are not transmitted from the first client prior to receipt of a specific instruction, and the specific instruction is independent of the actions detected in step (d).

37. The tangible machine-readable storage device of claim 36, comprising further instructions for performing steps comprising:

(f) receiving at the first client one or more instructions to transmit one or more edit requests corresponding to one or more of the local edits; and (g) transmitting one or more edit requests in response to the one or more instructions received in step (f).

38. The tangible machine-readable storage device of claim 36, comprising further instructions for performing steps comprising:

(f) saving the design data copy with the local edits incorporated in step (e);

(g) repeating steps (d) and (e) for a second copy of the design data; and (h) saving, without discarding the copy saved in step (f), the second design data copy with the local edits incorporated in step (g).

39. The tangible machine-readable storage device of claim 38, comprising further instructions for performing steps comprising:

(i) receiving at the first client a selection of the copy saved in step (f) or the copy saved in step (h); and (j) transmitting one or more edit requests corresponding to the copy selected in step (i).

40. The tangible machine-readable storage device of claim 34, wherein step (b) comprises receiving an instruction to draw the line such that a portion of a straddling design object is inside a region bounded by the line and a portion of the straddling design object is outside the region bounded by the line, and comprising further instructions for performing steps comprising:

(d) automatically expanding the protected portion to include the entire straddling design object.

41. A tangible machine-readable storage device having stored thereon data representing sequences of instructions which, when executed by a processor, cause the processor to perform steps of method for editing a printed circuit board design maintained in a common database storing printed circuit board design data incorporating edits from multiple clients, the steps comprising:

(a) transmitting design data from the common database to each of first and second clients, wherein the design data is graphically displayable at the first and second clients as a pattern of electronic components and connections between those components for at least a portion of the printed circuit board design, and the pattern of electronic components and connections between those components corresponds to a shared area of the printed circuit board design throughout which the first and second clients have simultaneous access to edit design objects and to cause modification of the common database to reflect said design object edits;

(b) subsequent to step (a), receiving from the first client a designation of a protected portion of the shared area, said protected portion defined by a line drawn at the first client;

(c) transmitting the line to the second client for display thereon; and (d) preventing the second client from editing parts of the shared area within the protected portion.

42. The tangible machine-readable storage device of claim 41, comprising further instructions for performing steps comprising:

(e) receiving a request from the second client to edit a part of the shared area within the protected portion; and (f) transmitting notification to the second client of rejection of the edit request received in step (e).

43. The tangible machine-readable storage device of claim 41, comprising further instructions for performing steps comprising:

(e) receiving a request from the second client to edit a part of the shared area not within the protected portion; and (f) transmitting synchronization data to the first client, said synchronization data permitting update of a first client display to reflect application to the shared area of the edit request received in step (e).

44. The tangible machine-readable storage device of claim 41, comprising further instructions for performing steps comprising:

(e) receiving from the first client one or more requests to edit parts of the shared area within the protected portion; and (f) applying to the protected portion the one or more edit requests received in step (e).

* * * * *

UNITED STATES PATENT AND TRADEMARK OFFICE
CERTIFICATE OF CORRECTION

| | | |
|---|---|---|
| PATENT NO. | : 7,587,695 B2 | Page 1 of 1 |
| APPLICATION NO. | : 10/869923 | |
| DATED | : September 8, 2009 | |
| INVENTOR(S) | : Petunin | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 50 days.

Signed and Sealed this
Twenty-eighth Day of December, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,587,695 B2 | Page 1 of 1 |
| APPLICATION NO. | : 10/869923 | |
| DATED | : September 8, 2009 | |
| INVENTOR(S) | : Petunin | |

It is certified that error appears in the above-identified patent and that said Letters Patent is hereby corrected as shown below:

On the Title Page:

The first or sole Notice should read:

Subject to any disclaimer, the term of this patent is extended or adjusted under 35 U.S.C. 154(b) by 50 days.

Signed and Sealed this
Fourth Day of January, 2011

David J. Kappos
*Director of the United States Patent and Trademark Office*